/

US009960015B2

(12) United States Patent
Valcore, Jr. et al.

(10) Patent No.: US 9,960,015 B2
(45) Date of Patent: May 1, 2018

(54) IMPEDANCE-BASED ADJUSTMENT OF POWER AND FREQUENCY

(71) Applicant: Lam Research Corporation, Fremont, CA (US)

(72) Inventors: John C. Valcore, Jr., Berkeley, CA (US); Bradford J. Lyndaker, San Ramon, CA (US)

(73) Assignee: Lam Research Corporation, Fremont, CA (US)

(*) Notice: Subject to any disclaimer, the term of this patent is extended or adjusted under 35 U.S.C. 154(b) by 0 days. days.

(21) Appl. No.: 15/448,880

(22) Filed: Mar. 3, 2017

(65) Prior Publication Data

US 2017/0178864 A1    Jun. 22, 2017

Related U.S. Application Data

(60) Division of application No. 14/850,851, filed on Sep. 10, 2015, now Pat. No. 9,607,810, which is a division of application No. 13/666,912, filed on Nov. 1, 2012, now Pat. No. 9,171,699, which is a continuation-in-part of application No. 13/531,491, filed on Jun. 22, 2012, now Pat. No. 9,114,666, said (Continued)

(51) Int. Cl.
*H01J 37/00*        (2006.01)
*H01J 37/32*        (2006.01)

(52) U.S. Cl.
CPC .. *H01J 37/32165* (2013.01); *H01J 37/32082* (2013.01); *H01J 37/3299* (2013.01); *H01J 37/32146* (2013.01); *H01J 37/32174* (2013.01); *H01J 37/32183* (2013.01); *H01J 37/32935* (2013.01); *H01J 37/32981* (2013.01)

(58) Field of Classification Search
CPC .......... H01J 37/32183; H01J 37/32174; H01J 37/32082; H01J 37/32935; H01J 37/32146; H01J 37/3299; H01J 37/32165; H01J 37/32926; H01J 37/3244; H01J 2237/327; H01J 37/32155; H01J 37/321; H01J 37/32706
See application file for complete search history.

(56) References Cited

U.S. PATENT DOCUMENTS 6,146,104 A * 11/2000 Mastroianni ............ B09C 1/002
                                                  166/370
6,238,512 B1 * 5/2001 Li ........................ H01J 37/321
                                                  118/723 FE (Continued)

*Primary Examiner* — Monica C King
(74) *Attorney, Agent, or Firm* — Martine Penilla Group, LLP

(57) ABSTRACT

Systems and methods for impedance-based adjustment of power and frequency are described. A system includes a plasma chamber for containing plasma. The plasma chamber includes an electrode. The system includes a driver and amplifier coupled to the plasma chamber for providing a radio frequency (RF) signal to the electrode. The driver and amplifier is coupled to the plasma chamber via a transmission line. The system further includes a selector coupled to the driver and amplifier, a first auto frequency control (AFC) coupled to the selector, and a second AFC coupled to the selector. The selector is configured to select the first AFC or the second AFC based on values of current and voltage sensed on the transmission line.

13 Claims, 17 Drawing Sheets

Related U.S. Application Data application No. 13/666,912 is a continuation-in-part of application No. 13/550,719, filed on Jul. 17, 2012, now Pat. No. 9,368,329.

(60) Provisional application No. 61/701,560, filed on Sep. 14, 2012, provisional application No. 61/602,040, filed on Feb. 22, 2012, provisional application No. 61/602,041, filed on Feb. 22, 2012.

(56) References Cited

U.S. PATENT DOCUMENTS

| | | | | |
|---|---|---|---|---|
| 6,406,590 B1* | 6/2002 | Ebata | ............... | C23C 16/45506 118/723 E |
| 2014/0076713 A1* | 3/2014 | Valcore, Jr. | ....... | H01J 37/32165 204/164 |

* cited by examiner

IMPEDANCE-BASED ADJUSTMENT OF POWER AND FREQUENCY

CLAIM OF PRIORITY

The present patent application is a divisional of and claims the benefit of and priority, under 35 U.S.C. § 120, to U.S. patent application Ser. No. 14/850,851, filed on Sep. 10, 2015, and titled "Impedance-based Adjustment of Power and Frequency", which is incorporated by reference herein in their entirety for all purposes.

The application Ser. No. 14/850,851 is a divisional of and claims the benefit of and priority, under 35 U.S.C. § 120, to U.S. patent application Ser. No. 13/666,912, filed on Nov. 1, 2012, and titled "Impedance-based Adjustment of Power and Frequency", now issued as U.S. Pat. No. 9,171,699, which claims the benefit of and priority, under 35 U.S.C. § 119(e), to U.S. Provisional Patent Application No. 61/701,560, filed on Sep. 14, 2012, and titled "Impedance-based Adjustment of Power and Frequency", which are incorporated by reference herein in their entirety for all purposes.

The application Ser. No. 13/666,912 is a continuation-in-part of and claims the benefit of and priority, under 35 U.S.C. § 120, to U.S. patent application Ser. No. 13/531,491, filed on Jun. 22, 2012, now issued as U.S. Pat. No. 9,114,666, and titled "Methods and Apparatus For Controlling Plasma In A Plasma Processing System", which is incorporated by reference herein in its entirety for all purposes.

The U.S. patent application Ser. No. 13/531,491 claims the benefit of and priority, under 35 U.S.C. § 119(e), to U.S. Provisional Patent Application No. 61/602,040, filed on Feb. 22, 2012, and titled "Frequency Enhanced Impedance Dependent Power Control For Multi-frequency Pulsing", which is incorporated by reference herein in its entirety for all purposes.

The U.S. patent application Ser. No. 13/531,491 claims the benefit of and priority, under 35 U.S.C. § 119(e), to U.S. Provisional Patent Application No. 61/602,041, filed on Feb. 22, 2012, and titled "Methods and Apparatus for Synchronizing RF Pulses in a Plasma System", which is incorporated by reference herein in its entirety for all purposes.

The application Ser. No. 13/666,912 is a continuation-in-part of and claims the benefit of and priority, under 35 U.S.C. § 120, to U.S. patent application Ser. No. 13/550,719, filed on Jul. 17, 2012, and titled "Methods and Apparatus For Synchronizing RF Pulses In A Plasma Processing System", now issued as U.S. Pat. No. 9,368,329, which is incorporated by reference herein in its entirety for all purposes.

The U.S. patent application Ser. No. 13/550,719 claims the benefit of and priority, under 35 U.S.C. § 119(e), to U.S. Provisional Patent Application No. 61/602,041, filed on Feb. 22, 2012, and titled "Methods and Apparatus for Synchronizing RF Pulses in a Plasma System", which is incorporated by reference herein in its entirety for all purposes.

CROSS-REFERENCE TO RELATED APPLICATIONS

The present patent application is related to application Ser. No. 13/620,386, filed on Sep. 14, 2012, titled "State-Based Adjustment of Power and Frequency", now issued as U.S. Pat. No. 9,197,196, which is incorporated by reference herein in its entirety for all purposes.

FIELD

The present embodiments relate to improving response time to a change in plasma impedance and/or to improving accuracy in stabilizing plasma, and more particularly, to apparatus, methods, and computer programs for impedance-based adjustment of power and frequency.

BACKGROUND

In some plasma processing systems, multiple radio frequency (RF) signals are provided to one or more electrodes within a plasma chamber. The RF signals help generate plasma within the plasma chamber. The plasma is used for a variety of operations, e.g., clean substrate placed on a lower electrode, etch the substrate, etc.

Between a driver and amplifier system that generates a radio frequency (RF) signal and the plasma chamber, an impedance matching circuit is usually placed. The impedance matching circuit matches an impedance of a load, e.g., plasma within the plasma chamber, with an impedance of a source, e.g., the driver and amplifier system that generates the RF signal. However, in certain situations, the impedance matching is not quick enough to respond to a change in the plasma impedance.

Moreover, although some systems are quick enough to respond to the change, these systems may not result in accurate adjustment of power and/or frequency to stabilize the plasma.

It is in this context that embodiments described in the present disclosure arise.

SUMMARY

Embodiments of the disclosure provide apparatus, methods and computer programs for state-based adjustment of power and frequency. It should be appreciated that the present embodiments can be implemented in numerous ways, e.g., a process, an apparatus, a system, a device, or a method on a computer-readable medium. Several embodiments are described below.

In an embodiment, a system includes a plasma chamber for containing plasma. The plasma chamber includes an electrode. The system includes a driver and amplifier (DA) system that is coupled to the plasma chamber for providing a radio frequency (RF) signal to the electrode. The DA system is coupled to the plasma chamber via a transmission line. The system further includes a selector coupled to the DA system, a first auto frequency control (AFC) coupled to the selector, and a second AFC coupled to the selector. The selector is configured to select the first AFC or the second AFC based on values of current and voltage sensed on the transmission line.

In one embodiment, a system includes a primary generator coupled to an electrode. The primary generator includes a primary driver and amplifier for supplying a primary radio frequency (RF) signal to the electrode. The primary generator further includes a primary automatic frequency tuner (AFT) to provide a first primary frequency input to the primary driver and amplifier when a pulsed signal is in a first state. The primary AFT is configured to provide a second primary frequency input to the primary driver and amplifier when the pulsed signal is in a second state. The system further includes a secondary generator coupled to the electrode.

In this embodiment, the secondary generator includes a secondary driver and amplifier for supplying a secondary RF signal to the electrode. The secondary generator further includes a first secondary AFT coupled to the secondary driver and amplifier. The secondary generator includes a second secondary AFT coupled to the secondary driver and amplifier. The secondary generator also includes a processor, which is coupled to the first secondary AFT and the second secondary AFT. The secondary generator further includes a sensor coupled to the electrode. The sensor is used for sensing current and voltage transferred between the secondary generator and the electrode during the first and second states. The processor is configured to generate parameters based on the current and voltage and is configured to determine whether a first one of the parameters for the first state exceeds a first boundary and whether a second one of the parameters for the second state exceeds a second boundary. The first secondary AFT is configured to provide a first secondary frequency input to the secondary driver and amplifier upon receiving the determination that the first parameter exceeds the first boundary and the second secondary AFT configured to provide a second secondary frequency input to the secondary driver and amplifier upon receiving the determination that the second parameter exceeds the second boundary.

In an embodiment, a system including a digital pulsing source for generating a pulsed signal is described. The system includes a primary generator. The primary generator includes a primary driver and amplifier coupled to an electrode for supplying a primary radio frequency (RF) signal to the electrode. The primary generator also includes one or more primary processors coupled to the digital pulsing source for receiving the pulsed signal. The one or more primary processors are configured to identify a first one of two states of the pulsed signal and a second one of the two states, determine to provide a primary power value to the primary driver and amplifier when the pulsed signal is in the first state, and determine to provide a primary frequency value of the primary RF signal when the pulsed signal is in the first state.

In this embodiment, the system further includes a secondary generator, which includes a secondary driver and amplifier coupled to the electrode for supplying a secondary RF signal to the electrode. The secondary generator further includes one or more secondary processors coupled to the digital pulsing source for receiving the pulsed signal. The one or more secondary processors are configured to determine whether a parameter associated with plasma exceeds a first boundary when the pulsed signal is in the first state, determine whether the parameter exceeds a second boundary when the pulsed signal is in the second state, and determine to provide a first secondary power value to the secondary driver and amplifier in response to determining that the parameter exceeds the first boundary. The one or more secondary processors are further configured to determine to provide a second secondary power value to the secondary driver and amplifier in response to determining that the parameter exceeds the second boundary, determine to provide a first secondary frequency value to the secondary driver and amplifier in response to determining that the parameter exceeds the first boundary, and determine to provide a second secondary frequency value to the secondary driver and amplifier in response to determining that the parameter exceeds the second boundary.

In an embodiment, a method includes receiving a digital pulsing signal, which has two states. The method includes receiving current and voltage values, calculating parameters associated with plasma impedance from the current and voltage power values, and determining during the first state whether a first one of the parameters exceeds a first boundary. The method also includes providing a first frequency value and a first power value to a radio frequency (RF) driver and amplifier upon determining that the first parameter exceeds the first boundary, determining during the second state whether a second one of the parameters exceeds a second boundary, and providing a second frequency value and a second power value to the RF driver and amplifier upon determining that the second parameter exceeds the second boundary.

Some advantages of the above-described embodiments include providing an accurate power and/or frequency value to stabilize plasma, e.g., to reduce a difference between an impedance of a source, e.g., RF driver and amplifier, and a load, e.g., plasma. The frequency and/or power value is accurate when the power and/or frequency value is generated based on a change in plasma impedance. For example, forward power and reflected power are measured and are used to generate a gamma value. It is determined whether the gamma value exceeds a threshold and if so, the power and/or frequency value is changed to stabilize plasma.

Other advantages of embodiments include reducing an amount of time to achieve stability in plasma. A training routine is used to determine frequency and/or power values to apply to a driver and amplifier system. The power and/or frequency values correspond to a gamma value that is also determined during the training routine. The training routine saves time during production, e.g., time for cleaning substrates, time for etching substrates, time for deposition material on substrates, etc. For example, during production, when it is determined that the gamma value exceeds a threshold, the power and/or frequency values are applied to the driver and amplifier system without a need to tune the power and/or frequency values.

Other aspects will become apparent from the following detailed description, taken in conjunction with the accompanying drawings.

BRIEF DESCRIPTION OF THE DRAWINGS

The embodiments may best be understood by reference to the following description taken in conjunction with the accompanying drawings.

DETAILED DESCRIPTION

The following embodiments describe systems and methods for impedance-based adjustment of power and frequency. It will be apparent that the present embodiments may be practiced without some or all of these specific details. In other instances, well known process operations have not been described in detail in order not to unnecessarily obscure the present embodiments.

Figure 1:
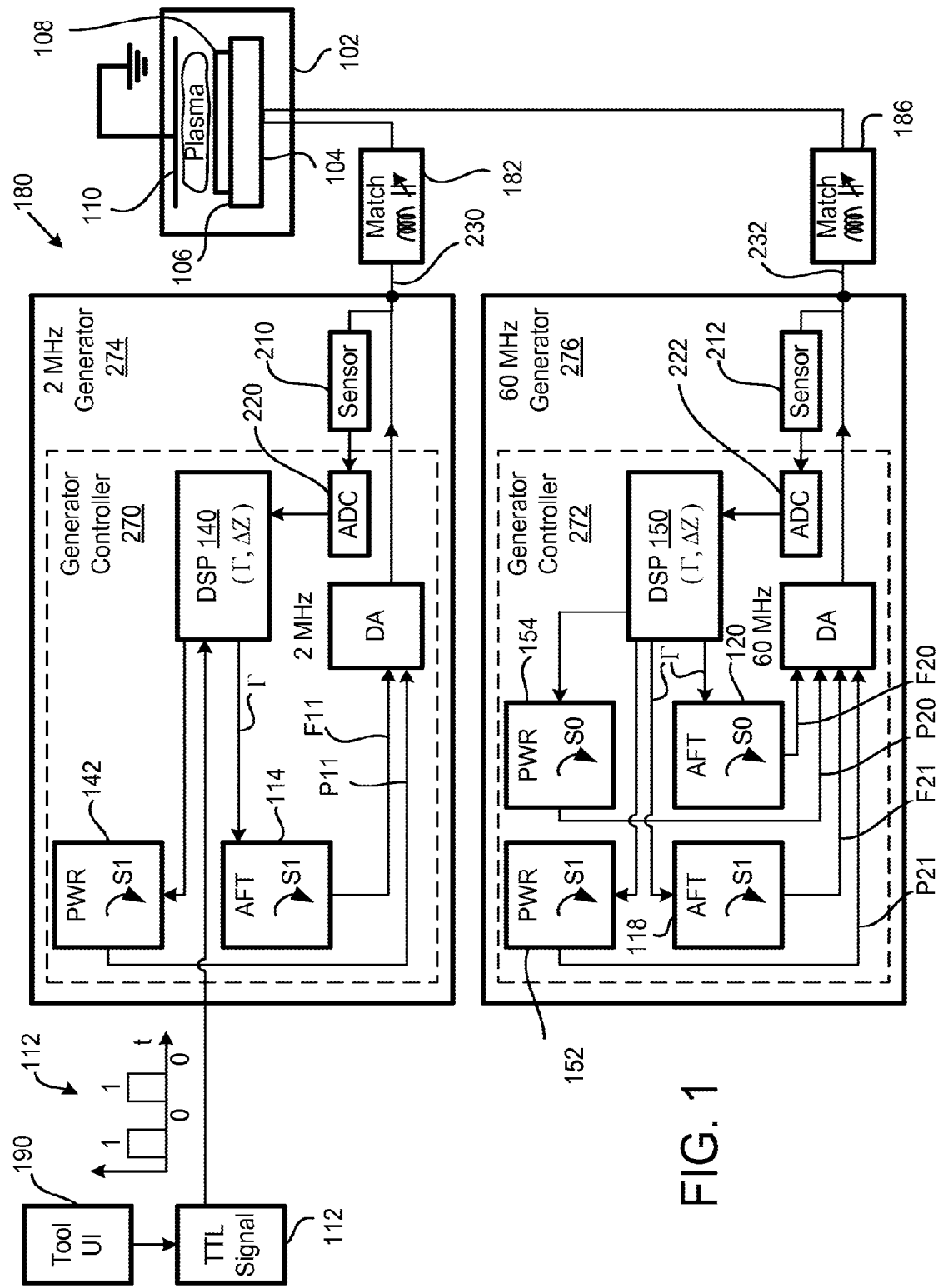
FIG. 1 is a block diagram of an embodiment of a system for changing a state based on plasma impedance, in accordance with an embodiment described in the present disclosure.

FIG. 1 is a block diagram of an embodiment of a system 180 for changing a state based on plasma impedance. A 2 megahertz (MHz) radio frequency (RF) driver and amplifier (DA) system supplies RF power via an impedance matching circuit 182 to a lower electrode 104 of a plasma chamber 102. Similarly, a 60 MHz DA system supplies RF power via an impedance matching circuit 186 to the lower electrode 104. It should be noted that in one embodiment, instead of the 60 MHz source, a 27 MHz source is used to provide RF power to the lower electrode 104. Moreover, it should be noted that the values 2 MHz, 27 MHz, and 60 MHz are provided as examples and are not limiting. For example, instead of the 2 MHz DA system, a 2.5 MHz DA system may be used and instead of the 60 MHz DA system, a 65 MHz DA system may be used. In another embodiment, in addition to the 2 MHz source and the 60 MHz sources, the 27 MHz source is used to provide RF power to the lower electrode 104.

An impedance matching circuit includes electric circuit components, e.g., inductors, capacitors, etc. to match an impedance of a power source coupled to the impedance matching circuit with an impedance of a load coupled to the impedance matching circuit. For example, the impedance matching circuit 182 matches an impedance of the 2 MHz DA system with an impedance of plasma generated within the plasma chamber 102. As another example, an impedance matching circuit 186 matches an impedance of the 60 MHz DA system with an impedance of plasma generated within the plasma chamber 102. As yet another example, the impedance matching circuit 182 matches an impedance of the 2 MHz DA system with an impedance of a portion, e.g., the plasma and the lower electrode 104, of the plasma chamber 102. In one embodiment, an impedance matching circuit is tuned to facilitate a match between an impedance of an RF DA system coupled to the impedance matching circuit and an impedance of a load. An impedance match between a power source and a load reduces chances of power being reflected from the load towards the power source.

The plasma chamber 102 includes the lower electrode 104, an upper electrode 110, and other components (not shown), e.g., an upper dielectric ring surrounding the upper electrode 110, a lower electrode extension surrounding the upper dielectric ring, a lower dielectric ring surrounding the lower electrode, a lower electrode extension surrounding the lower dielectric ring, an upper plasma exclusion zone (PEZ) ring, a lower PEZ ring, etc. The upper electrode 110 is located opposite to and facing the lower electrode 104. A substrate 108, e.g., a semiconductor wafer, is supported on an upper surface 106 of the lower electrode 104. Integrated circuits, e.g., application specific integrated circuit (ASIC), programmable logic device (PLD), etc. are developed on the substrate 108 and the integrated circuits are used in a variety of devices, e.g., cell phones, tablets, smart phones, computers, laptops, networking equipment, etc. The lower electrode 104 is made of a metal, e.g., anodized aluminum, alloy of aluminum, etc. Also, the upper electrode 110 is made of a metal, e.g., aluminum, alloy of aluminum, etc.

In one embodiment, the upper electrode 110 includes a hole that is coupled to a central gas feed (not shown). The central gas feed receives one or more process gases from a gas supply (not shown). Examples of a process gases include an oxygen-containing gas, such as $O_2$. Other examples of a process gas include a fluorine-containing gas, e.g., tetrafluoromethane ($CF_4$), sulfur hexafluoride ($SF_6$), hexafluoroethane ($C_2F_6$), etc. The upper electrode 110 is grounded. The lower electrode 104 is coupled to the 2 MHz RF DA system via the impedance matching circuit 182 and to the 60 MHz RF DA system via the impedance matching circuit 186.

When the process gas is supplied between the upper electrode 110 and the lower electrode 104 and when a DA system, e.g., the 2 MHz DA system and/or the 60 MHz DA system, supplies power via a corresponding impedance matching circuit to the lower electrode 104, the process gas is ignited to generate plasma within the plasma chamber 102. For example, the 2 MHz DA system supplies power via the impedance matching circuit 182 to ignite the process gas to generate plasma.

A tool user interface (UI) 190 on a computer (not shown) is used to generate a transistor-transistor logic (TTL) signal 112, which is a digital pulsing signal. In one embodiment, the computer includes a TTL circuit. As used herein, instead of a computer, a processor, a controller, an ASIC, or a PLD is used, and these terms are used interchangeably herein. The TTL signal 112 includes states S1 and S0. The TTL signal 112 has a 50% duty cycle. In one embodiment, the TTL signal 112 has a duty cycle ranging from 5% to 95%. An example of the state S1 includes an on state, a state having a value of 1, or a high state. An example of the state S0 includes an off state, a state having a value of 0, or a low state. The high value is greater than the low value.

In another embodiment, instead of the computer, a clock oscillator, e.g., a crystal oscillator, is used to generate an analog clock signal, which is converted by an analog-to-digital converter into a digital signal similar to the TTL signal 112. For example, a crystal oscillator is made to oscillate in an electric field by applying a voltage to an electrode near or on the crystal oscillator.

The TTL signal 112 is sent to a digital signal processor (DSP) 140 and another DSP 150. The DSP 140 receives the TTL signal 112 and identifies the states S0 and S1 of the TTL signal 112. For example, the DSP 140 distinguishes between the states S0 and S1. As another example, the DSP 140 determines that the TTL signal 112 has a first magnitude during a first set of time periods and has a second magnitude during a second set of time periods. The DSP 140 determines that the TTL signal 112 has the state S1 during the first set of time periods and has the state S0 during the second set of time periods. As yet another example, the DSP 140 compares a magnitude of the TTL signal 112 with a pre-stored value to determine that the magnitude of the TTL signal 112 is greater than the pre-stored value during the first set of time periods and that the magnitude during the state S0 of the TTL signal 112 is not greater than the pre-stored value during the second set of time periods. In the embodiment in which the clock oscillator is used, the DSP 140 receives an analog clock signal from the clock oscillator, converts the analog signal into a digital form, and then identifies the two states S0 and S1.

The DSP 140 stores the identified states S0 and S1 in memory locations of one or more memory devices within the DSP. Examples of a member device include a random access memory (RAM) and a read-only memory (ROM). A memory device may be a flash memory, a hard disk, a storage device, a computer-readable medium, etc.

The DSP 140 provides the identified state S1 from corresponding memory locations to an auto frequency tuner (AFT) 114 and to a power controller 142. For example, the DSP 140 indicates to the AFT 114 and the power controller 142 that the TTL signal 112 is in the state S1 between times t1 and t2 of a duty cycle. The terms tuner and controller are used interchangeably herein. An example of an AFT is provided in U.S. Pat. No. 6,020,794, which is incorporated by reference herein in its entirety.

In one embodiment, instead of a controller or a tuner, a control logic block, e.g., a computer program, that is executed by a processor is used. For example, each AFT of a generator is a logic block that is executed by a processor of the generator. As another example, each power controller of a generator is a logic block that is executed by a processor of the generator. A computer program is embodied in a non-transitory computer-readable medium, examples of which are provided below.

The AFT 114 determines a frequency value based on a state of the TTL signal 112 and the power controller 142 determines a power value based on a state of the TTL signal 112. For example, the AFT 114 determines that a frequency value F11 is to be provided to the 2 MHz DA system when the state of the TTL signal 112 is S1 and the power controller 142 determines that a power value P11 is to be provided to the 2 MHz DA system when the state of the TTL signal 112 is S1.

When the state of the TTL signal 112 is S1, the power controller 142 provides the power value of P11 to the 2 MHz DA system. During the state S1 of the TTL signal 112, the AFT 114 provides the frequency value of F11 to the 2 MHz DA system.

The 2 MHz DA system receives the frequency value of F11 and the power value of P11 during the state S1. Upon receiving the values F11 and P11, the 2 MHz DA system generates an RF signal having the frequency F11 and the RF signal has the power value of P11.

In one embodiment, an RF DA system includes a driver followed by an amplifier. The amplifier supplies forward power via a transmission line to the plasma chamber 102. For example, the amplifier of the 2 MHz DA system supplies forward power having a power value that is proportional, e.g., same as, multiple of, etc. to the power value P11 and having the frequency value F11 via a transmission line 230 and the impedance matching circuit 182 to the plasma chamber 102.

When the TTL signal 112 transitions from the state S0 to the state S1 and when the 2 MHz DA system supplies forward power having the power value proportional to the power value P11 and having the frequency value F11 to the plasma chamber 102, impedance within the plasma chamber 102 changes. When the impedance within the plasma chamber 102 changes as a result of transition of the TTL signal 112 from the state S0 to the state S1, a sensor 212 of a 60 MHz generator 276 measures forward power and reflected power, which is RF power reflected from the plasma of the plasma chamber 102, on a transmission line 232. The sensor 212 provides the measurement of the forward and reflected powers to an analog-to-digital (ADC) converter 222, which converts the measurements from an analog format to a digital format. The digital values of the forward and reflected powers are provided to a DSP 150. In an embodiment, a DSP includes an ADC. It should further be noted that in one embodiment, the DSP 150 lacks reception of the TTL signal 112. Rather, in this embodiment, the DSP 150 receives another digital pulsed signal that may not be synchronous with the TTL signal 112. In one embodiment, the other digital pulsed signal received by the DSP 150 is synchronous with the TTL signal 112.

During the state S1 of the TTL signal 112, e.g., immediately after the state transition from S0 to S1 of the TTL signal 112, the DSP 150 calculates a relationship, e.g., a square root of a ratio of the digital reflected power signal and the digital forward power signal, a voltage standing wave ratio (VSWR), etc., during the state S1 to generate a first gamma value. A gamma value of 1 indicates a high degree of mismatch between impedances of a source and a load and a gamma value of 0 indicates a low degree of mismatch between impedances of a source and a load. If a gamma value is zero, power delivery to the plasma chamber 102 is deemed highly efficient. If the gamma value is 1, the power delivery is deemed highly inefficient. The VSWR is calculated as being equal to a ratio of RC−1 and RC+1, where RC is a reflection coefficient.

The DSP 150 determines whether the first gamma value is greater than a first threshold. When the DSP 150 determines that the first gamma value is greater than the first threshold, the DSP 150 indicates the same to an AFT 118 and to a power controller 152. The AFT 118 determines a frequency value F21 corresponding to the first gamma value and provides the frequency value F21 to the 60 MHz DA system. Moreover, the power controller 152 determines a power value P21 corresponding to the first gamma value and provides the power value P21 corresponding to the first gamma value to the 60 MHz DA system. For example, the AFT 118 stores within a memory device, a table that maps the first gamma value with the frequency value F21 and the power controller 152 stores within a memory device a mapping between the power value P21 and the first gamma value.

In one embodiment, the AFT 118 determines each of the frequency value F21 and the power value P21 as corresponding to the first threshold. For example, the AFT 118 stores within a memory device, a table that maps the first threshold with the frequency value F21 and the power controller 152 stores within a memory device a mapping between the power value P21 and the first threshold.

The 60 MHz DA system receives the frequency value of F21 and the power value of P21 during the state S1 of the TTL signal 112. Upon receiving the values F21 and P21, the 60 MHz DA system generates an RF signal having the frequency F21 and the RF signal has the power value of P21. For example, an amplifier of the 60 MHz DA system supplies forward power having a power value that is proportional, e.g., same as, multiple of, etc. to the power value P21 and having the frequency value F21 via the transmission line 232 and the impedance matching circuit 186 to the plasma chamber 102.

When the state of the TTL signal 112 changes from S1 to S0, no power value and no frequency value is provided to the 2 MHz DA system. During the state S0, no frequency value is provided to the 2 MHz DA system. The 2 MHz DA system does not receive any frequency and power values, e.g., receives the frequency value of 0 and the power value of 0, during the state S0. Upon not receiving power and frequency values, the 2 MHz DA system generates RF power at a frequency of zero and RF power having a power value of zero. The amplifier of the 2 MHz DA system does not supply forward power, e.g., supplies forward power having a power value of zero and having a frequency value of zero, via the transmission line 230 and the impedance matching circuit 182 to the plasma chamber 102.

Moreover, when the state of the TTL signal 112 changes to the state S0 from the state S1, the impedance of plasma within the plasma chamber 102 changes. Again, during the state S0 of the TTL signal 112, e.g., immediately after the transition from the state S1 to the state S0 of the TTL signal 112, the sensor 212 determines the forward and reflected powers on the transmission line 232 and provides the measured forward and reflected powers to an ADC 222. The ADC 222 converts the measured forward and reflected powers from analog format to a digital format. The DSP 150 receives the digital forward and reflected powers from the ADC 222 and calculates a second gamma value from the forward and reflected powers.

The DSP 150 compares the second gamma value to a second threshold and determines whether the second gamma value is greater than the second threshold. When the DSP 150 determines that the second gamma value is greater than the second threshold, the DSP 150 indicates the same to an AFT 118 and to the power controller 152. The AFT 118 determines a frequency value F20 corresponding to the second gamma value and provides the frequency value F20 to the 60 MHz DA system. Moreover, the power controller 152 determines a power value P20 corresponding to the second gamma value and provides the power value P20 corresponding to the second gamma value to the 60 MHz DA system. For example, the AFT 118 stores within a memory device, a table that maps the second gamma value with the frequency value F20 and the power controller 152 stores within a memory device a mapping between the power value P20 and the second gamma value.

In one embodiment, the AFT 118 determines each of the frequency value F20 and the power value P20 as corresponding to the second threshold. For example, the AFT 118 stores within a memory device, a table that maps the second threshold with the frequency value F20 and the power controller 152 stores within a memory device a mapping between the power value P20 and the second threshold.

The 60 MHz DA system receives the frequency value of F20 and the power value of P20 during the state S0 of the TTL signal 112. Upon receiving the values F20 and P20, the 60 MHz DA system generates an RF signal having the frequency F20 and the RF signal has the power value of P20. For example, an amplifier of the 60 MHz DA system supplies forward power having a power value that is proportional, e.g., same as, multiple of, etc. to the power value P20 and having the frequency value F20 via the transmission line 232 and the impedance matching circuit 186 to the plasma chamber 102.

The use of measurement of forward and reflected powers to change RF power provided by the 60 MHz DA system results in plasma stability. Also, the plasma stability is based on real-time measurement of forward and reflected powers. This real-time measurement provides accuracy in stabilizing the plasma.

In one embodiment, during one or both the states S1 and S0, a sensor 210 of the 2 MHz generator 274 senses RF power reflected from the plasma of the plasma chamber 102 on the transmission line 230. Moreover, during one or both the states S1 and S0, the sensor 210 senses forward power on the transmission line 230 when the forward power is sent from the 2 MHz RF DA system via the transmission line 230 to the plasma chamber 102. Similarly, during one or both the states S1 and S0, the sensor 212 senses power reflected from the plasma of the plasma chamber 102. The reflected power sensed by the sensor 212 is reflected on the transmission line 232 from the plasma of the plasma chamber 102. Moreover, during one or both the states S1 and S0 of the TTL signal 112, the sensor 212 senses forward power on the transmission line 232 when the forward power is sent from the 60 MHz RF DA system via the transmission line 232 to the plasma chamber 102.

In this embodiment, an analog-to-digital converter (ADC) 220 converts the measured reflected and forward powers sensed by the sensor 210 from an analog form to a digital form and the ADC 222 converts the measured reflected and forward powers sensed by the sensor 212 from an analog to a digital form. During one or both the states S1 and S0, the DSP 140 receives the digital values of the reflected power signal and the forward power signal sensed by the sensor 210 and the DSP 150 receives the digital value of the reflected power signal and the forward power signal sensed by the sensor 212.

Furthermore, in this embodiment, a gamma value that is generated from the digital values of the forward and reflected powers on the transmission line 230 during the state S1 is sent from the DSP 140 to the AFT 114 and a gamma value that is generated from the digital values of the forward and reflected powers on the transmission line 232 during the state S1 is sent from the DSP 150 to the AFT 118. During the state S1, the AFT 114 determines a frequency value based on the value of gamma received from the DSP 140 and the AFT 118 determines a frequency value based on the value of gamma received from the DSP 150. During the state S1, the AFT 114 adjusts the frequency value of F11 based on the frequency value that is generated based on the gamma value and provides the adjusted frequency value to the 2 MHz DA system. Moreover, during the state S1, the AFT 118 adjusts the frequency value of F21 based on the frequency value that is generated based on the gamma value and provides the adjusted frequency value to the 60 MHz DA system.

Moreover, in the same embodiment, during the state S1, the power controller 142 determines a power value based on the value of gamma received from the DSP 140 and the power controller 152 determines a power value based on the value of gamma received from the DSP 150. During the state S1, the power controller 142 adjusts the power value of P11 based on the power value that is generated based on the gamma value and provides the adjusted power value to the 2 MHz DA system. Moreover, during the state S1, the power controller 152 adjusts the power value of P21 based on the power value that is generated based on the gamma value and provides the adjusted power value to the 60 MHz DA system.

Further, in this embodiment, during the state S1, the 2 MHz DA system generates a power signal having the adjusted frequency value received from the AFT 114 and having the adjusted power value received from the power controller 142, and supplies the power signal via the impedance matching circuit 182 to the plasma chamber 102. Similarly, during the state S1, the 60 MHz DA system generates a power signal having the adjusted frequency value received from the AFT 118 and having the adjusted power value received from the power controller 152, and supplies the power signal via the impedance matching circuit 186 to the plasma chamber 102.

Furthermore, in the same embodiment, during the state S0, there is no provision of power and frequency values to the 2 MHz DA system and there is no use of a gamma value generated during the state S0 to adjust the zero frequency and power values of the 2 MHz DA system. A gamma value that is generated from the digital values of the forward and reflected powers on the transmission line 232 during the state S0 is sent from the DSP 150 to the AFT 120. The AFT 120 determines a frequency value based on the value of gamma received from the DSP 150. During the state S0, the AFT 120 adjusts the frequency value of F20 based on the frequency value that is generated from the gamma value and provides the adjusted frequency value to the 60 MHz DA system. Moreover, during the state S0, the power controller 154 determines a power value based on the value of gamma received from the DSP 150. During the state S0, the power controller 154 adjusts the power value of P20 based on the power value that is generated based on the gamma value and provides the adjusted power value to the 60 MHz DA system. During the state S0, the 60 MHz DA system generates a power signal having the adjusted frequency value received from the AFT 120 and having the adjusted power value received from the power controller 154, and supplies the power signal via the impedance matching circuit 186 to the plasma chamber 102.

It should be noted that in this embodiment, a difference between an adjusted value that is generated by adjusting a value and the value is smaller than a difference between another power or frequency value that is generated by using the first or second threshold. For example, a difference between the adjusted power value generated from the power value P21 and the power value P21 is less than a difference between the power values P21 and P20. As another example, a difference between the adjust frequency value generated from the frequency value F20 and the frequency value F20 is less than a difference between the frequency values F21 and F20.

The power controller 142, the AFT 114, and the DSP 140 are parts of a generator controller 270. The generator controller 270, the ADC 220, the sensor 210, and the 2 MHz DA system are parts of a 2 MHz generator 274. Similarly, the power controller 152, the power controller 154, the AFTs 118 and 120, and the DSP 150 are parts of a generator controller 272. The generator controller 272, the ADC 222, the sensor 212, and the 60 MHz DA system are parts of the 60 MHz generator 276.

In one embodiment, the system 180 excludes the impedance matching circuits 182 and/or 186. In an embodiment, a single controller is used instead of the power controller 142 and the AFT 114, a single controller is used instead of the power controller 152 and the AFT 118, and a single controller is used instead of the power controller 154 and the AFT 120.

In the embodiment in which the 27 MHz DA system is used in addition to using the 2 and 60 MHz DA systems, a 27 MHz generator is similar to the 60 MHz generator 276 except that the 27 MHz generator includes the 27 MHz DA system instead of the 60 MHz DA system. The 27 MHz generator is coupled to the lower electrode 104 of the plasma chamber 102 via an impedance matching circuit (not shown) and a transmission line (not shown). Moreover, the 27 MHz DA system is coupled to a digital pulsed signal source, other than the Tool UI 190, and a digital pulsed signal generated by the digital pulsed signal source may not be synchronous with the TTL signal 112. An example of a digital pulsed signal source includes a clock oscillator or a computer that includes a TTL circuit that generates a TTL signal. In one embodiment, the digital pulsed signal generated by the digital pulsed signal source is synchronous with the TTL signal 112. The 27 MHz generator includes two power controllers, two AFTs, a DSP, an ADC, a sensor, and the 27 MHz DA system.

In an embodiment, the first threshold and the second threshold are generated during a training routine, e.g., a learning process. During the training routine, when the 2 MHz DA system changes its RF power signal from a low power value to a high power value, there is an impedance mismatch between one or more portions, e.g., plasma, etc., within the plasma chamber 102 and 60 MHz DA system. The high power value is higher than the low power value. The 2 MHz DA system changes a state of its RF power signal from the low power value to the high power value when a state of the TTL signal 112 or a clock signal supplied to the 2 MHz RF DA system changes from S0 to S1. In this case, the 60 MHz DA system has its frequency and power tuned when the 2 MHz DA system starts supplying power at the high power value. To reduce the impedance mismatch, the 60 MHz DA system starts tuning, e.g., converging, to a power value and to a frequency value. The convergence may be determined by the DSP 150 based on a standard deviation or another technique. To allow the 60 MHz DA system more time to converge to the power value and to the frequency value, the 2 MHz DA system is kept at the high power value for an extended period of time than a usual period of time. The usual period of time is an amount of time in which the impedance mismatch is not reduced, e.g., removed. An example of the usual period of time is equal to half cycle of the TTL signal 112. When the 60 MHz DA system converges to the power value and the frequency value, the converged power value is stored as the power value P21 within the power controller 152 and the converged frequency value is stored as the frequency value F21 within the AFT 118. The first threshold is generated from the power value P21 during the training routine and the first gamma value corresponds to the frequency value F21. For example, the sensor 212 measures the forward power value and a reflected power value during the training routine. The sensor 212 measures the forward and reflected power values during the training routine when the frequency of the 60 MHz signal is F21. The ADC 222 converts the measured forward and reflected values from an analog format to a digital format. The DSP 150 receives the digital forward power value of P21 and the digital reflected power value from the ADC 222 and generates the first threshold from the power value P21 and the digital reflected power value measured during the training routine.

Similarly, during the training routine, the power value P20 and the frequency values F20 are generated when the 2 MHz DA system changes its RF power signal from the high power value to the low power value. The power value P20 is stored in the power controller 154 and the frequency value F20 is stored in the AFT 120. Also, the power value P20 is used to generate the second threshold during the training routine in a similar manner in which the first threshold is generated from the power value P21. The second threshold corresponds to the frequency value F20. For example, when the power value of the 60 MHz signal is determined to be P20, the frequency value of the 60 MHz signal is F20.

In an embodiment, instead of the DSP 150, the AFT 118 and the power controller 152 determine whether the first gamma value is greater than the first threshold. In this embodiment, the DSP 150 provides the first gamma value to the AFT 118 and the power controller 152. When the AFT 118 determines that the first gamma value is greater than the first threshold, the AFT 118 determines the frequency value F21 corresponding to the first gamma value and provides the frequency value F21 to the 60 MHz DA system. Moreover, when the power controller 152 determines that the first gamma value is greater than the first threshold, the power controller 152 determines the power value P21 corresponding to the first gamma value and provides the power value P21 to the 60 MHz DA system.

Moreover, in this embodiment, instead of the DSP 150, the AFT 120 and the power controller 154 determine whether the second gamma value is greater than the second threshold. In this embodiment, the DSP 150 provides the second gamma value to the AFT 120 and the power controller 154. When the AFT 120 determines that the second gamma value is greater than the second threshold, the AFT 120 determines the frequency value F20 corresponding to the second gamma value and provides the frequency value F20 to the 60 MHz DA system. Moreover, when the power controller 154 determines that the second gamma value is greater than the second threshold, the power controller 154 determines the power value P20 corresponding to the second gamma value and provides the power value P20 to the 60 MHz DA system.

In an embodiment, instead of the sensor 212 sensing the forward and reflected powers, complex voltage and current are sensed and gamma is generated from the sensed values voltage and current. For example, one or more sensors, e.g., voltage sensors, current sensors, etc. sense current and voltage on the transmission line 232, and provide the sensed current and voltage values as complex values to the DSP 150. The DSP 150 calculates forward and reflected powers from the sensed current and voltage values, and generates gamma values from the forward and reflected powers.

In one embodiment, instead of the sensor 212 sensing the forward and reflected powers, during the state S1 of the TTL signal 112, a first comparator compares voltage or current, which is reflected on the transmission line 232, to determine whether the voltage or current is greater than a first pre-determined value. During the state S1 of the TTL signal 112, when the voltage or current is greater than the first pre-determined value, the first comparator provides a first signal to the DSP 150 and when the voltage or current is not greater than the first pre-determined value, the comparator provides a second signal to the DSP 150. In response to receiving the first signal, the DSP 150 identifies that the voltage or current is greater than the first pre-determined value and in response to receiving the second signal, the DSP 150 identifies that the voltage or current does not exceed the first pre-determined value. When the DSP 150 identifies that the voltage or current exceeds the first pre-determined value, the DSP 150 determines the frequency value F21 corresponding to the first pre-determined value and provides the frequency value F21 to the AFT 118. Moreover, upon receiving the indication that the voltage or current exceeds the first pre-determined value, the DSP 150 determines the power value P21 corresponding to the first pre-determined value and provides the power value P21 to the power controller 152. The comparator is coupled to the DSP 150.

In this embodiment, during the state S0 of the TTL signal 112, the comparator compares voltage or current, which is reflected on the transmission line 232, to determine whether the voltage or current is greater than a second pre-determined value. When the voltage or current is greater than the second pre-determined value, the comparator provides the first signal to the DSP 150 and when the voltage or current is not greater than the second pre-determined value, the comparator provides the second signal to the DSP 150. In response to receiving the first signal during the state S0 of the TTL signal 112, the DSP 150 identifies that the voltage or current is greater than the second pre-determined value and in response to receiving the second signal during the state S0 of the TTL signal 112, the DSP 150 identifies that the voltage or current does not exceed the second pre-determined value. When the DSP 150 determines that the voltage or current exceeds the second pre-determined value, the DSP 150 determines the frequency value F20 corresponding to the second pre-determined value and provides the frequency value F20 to the AFT 120. Moreover, upon receiving the indication that the voltage or current exceeds the second pre-determined value, DSP 150 determines the power value P20 corresponding to the second pre-determined value and provides the power value P20 to the power controller 154. In an embodiment, a comparator includes analog circuitry, e.g., one or more operational amplifiers.

Figure 2:
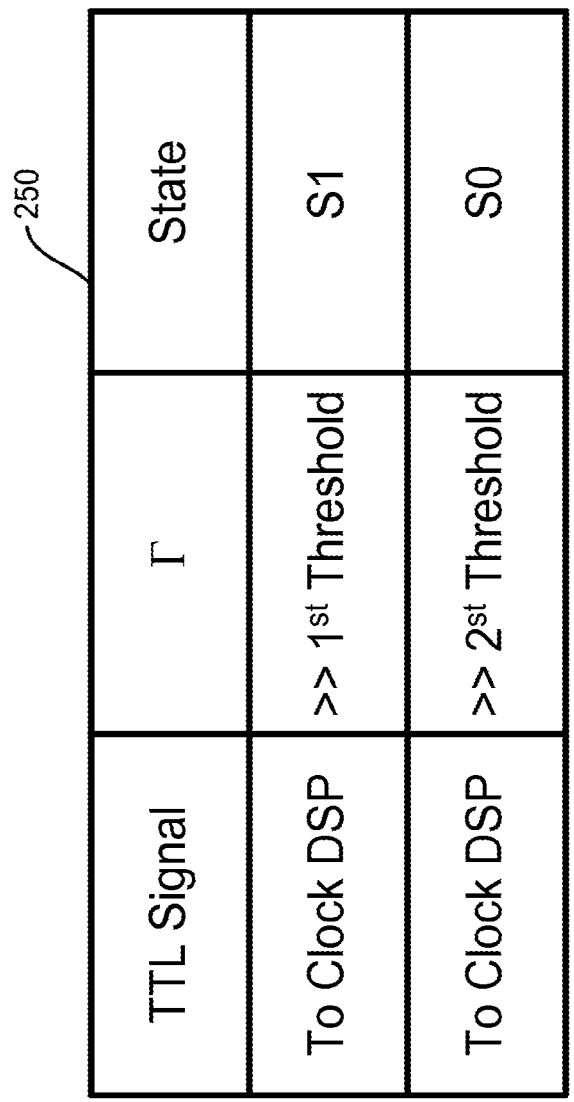
FIG. 2 is an embodiment of a table showing a change in states based on whether a gamma value is greater than a first threshold or a second threshold, in accordance with an embodiment described in the present disclosure.

FIG. 2 is an embodiment of a table 250 showing a change in states based on whether a gamma value is greater than the first threshold or the second threshold. As indicated in the table 250, the TTL signal 112 is used to provide a digital pulsed signal, e.g., a clock signal, to the DSP 140 (FIG. 1).

When the TTL signal 112 is in the state S1, the 2 MHz signal has the high power level. During the state S1 of the TTL signal 112, it is determined whether a gamma value exceeds the first threshold. In response to determining that the gamma value exceeds the first threshold, power value of the 60 MHz signal is changed to the power value P20 from the power value P21 and the frequency value of the 60 MHz signal is changed from the frequency value F20 to the frequency value F21 to achieve a state S1.

Also, when the TTL signal 112 is in the state S0, the 2 MHz signal has the low power level. During the state S0 of the TTL signal 112, it is determined whether a gamma value exceeds the second threshold. In response to determining that the gamma value exceeds the second threshold, power value of the 60 MHz signal is changed to the power value P21 from the power value P20 and the frequency value of the 60 MHz signal is changed from the frequency value F21 to the frequency value F20 to achieve a state S0.

Figure 3:
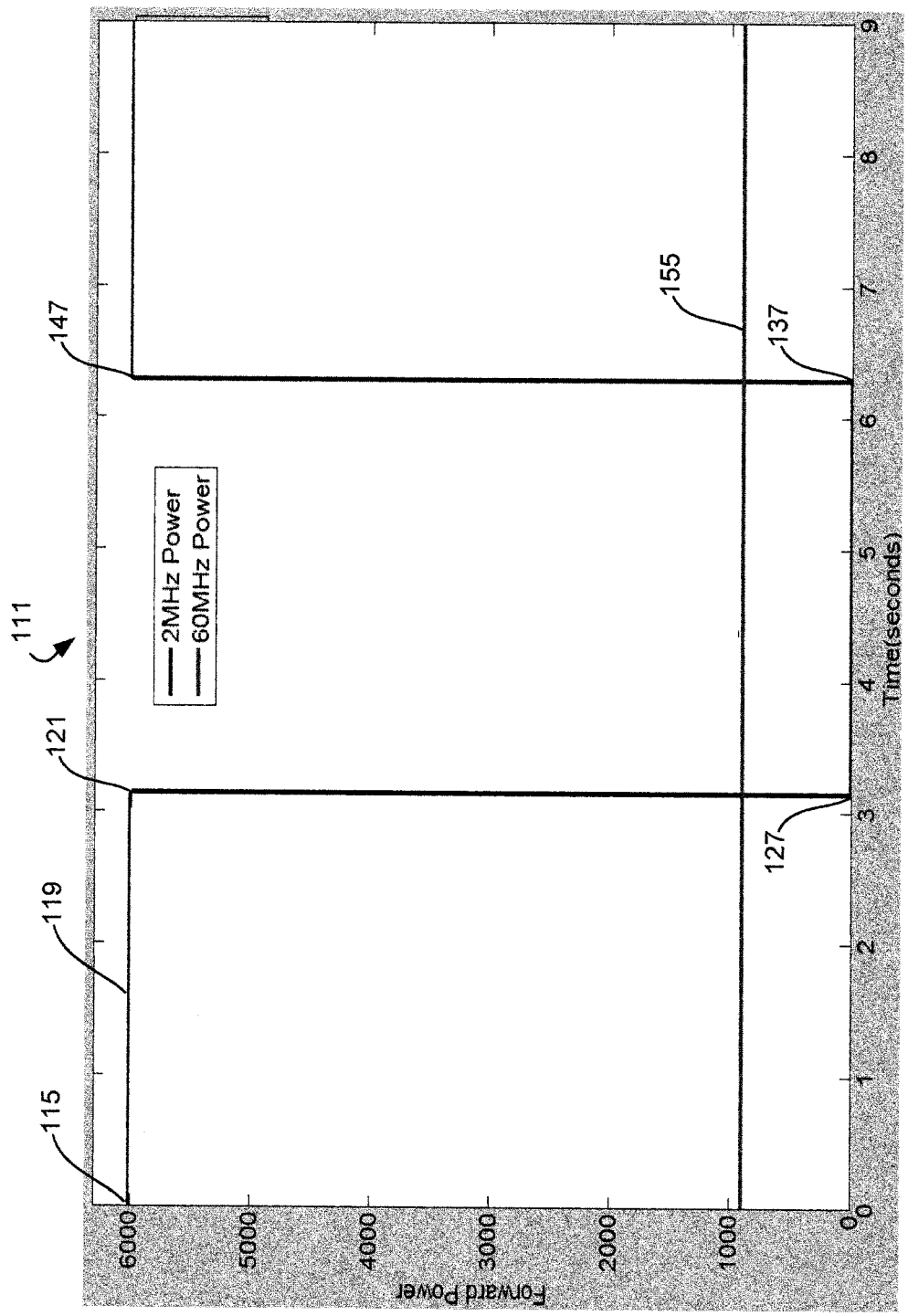
FIG. 3 shows an embodiment of a graph, which is a plot of a forward power versus time of two RF signals during a training routine, in accordance with an embodiment described in the present disclosure.

FIG. 3 shows an embodiment of a graph 111, which is a plot of a forward power versus time of two RF signals, the 2 MHz signal and the 60 MHz signal during the training routine. In an embodiment, the training routine is performed once to determine tuned RF values, e.g., the power values P20 and P21, the frequency values F20 and F21, the threshold values, etc., or performed once during a time period to account for, for example, plasma impedance. In this example, the 2 MHz signal is an independently pulsing (IP) RF signal and the 60 MHz signal represents a dependent RF signal that tunes its RF frequency to optimize power delivery when the 2 MHz RF signal pulses. Although only one dependent RF generator (e.g., 60 MHz) is discussed in connection with FIG. 3, it should be understood that there may be multiple dependent RF generators, each of which may undergo a similar training routine to ascertain its own optimal tuned RF frequencies and thresholds when the IP RF signal pulses.

Figure 4:
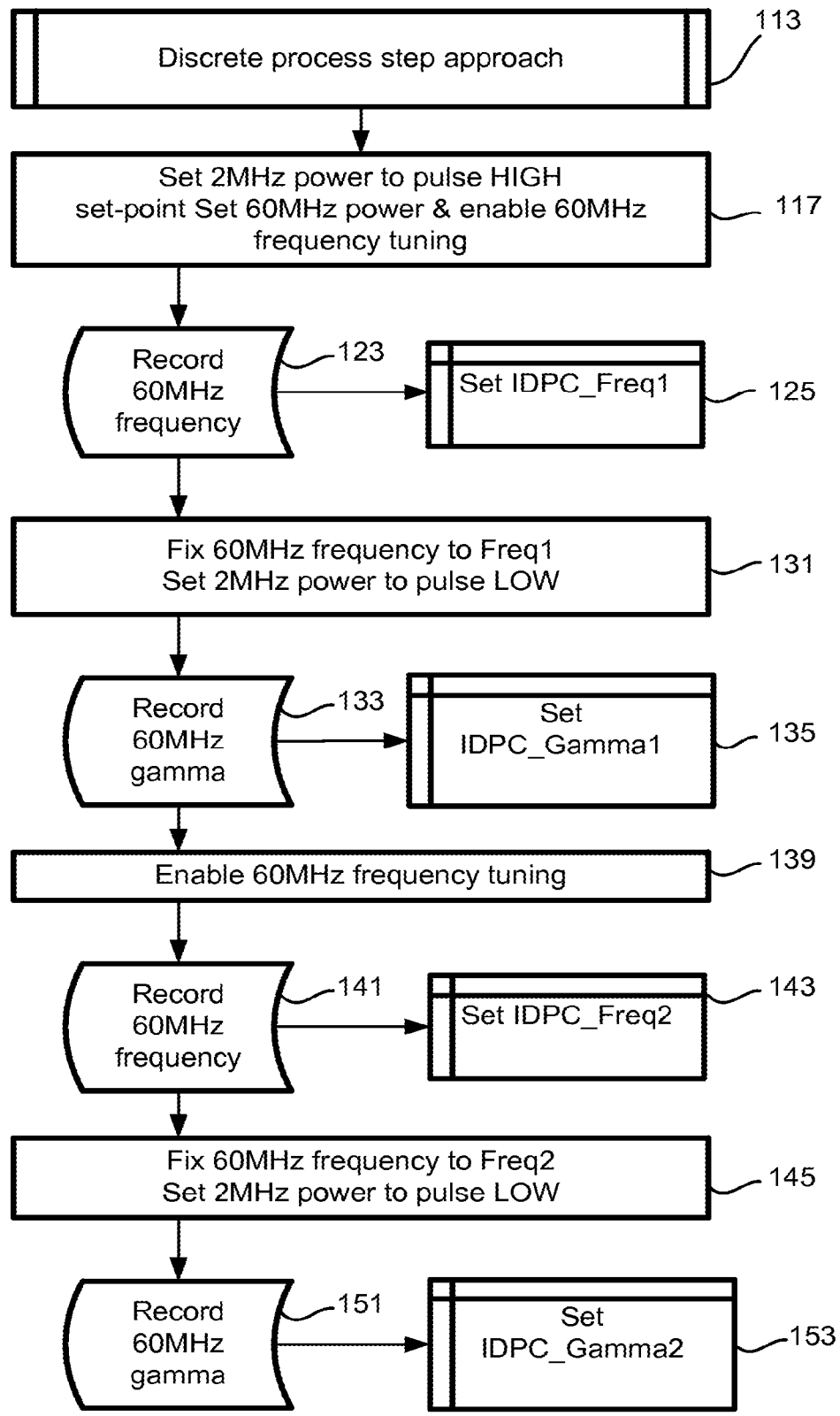
FIG. 4 is an embodiment of a flowchart of a training routine, in accordance with an embodiment described in the present disclosure.

FIG. 3 may be better understood when studied in conjunction with an embodiment of a flowchart of a method 113, which is described with reference to FIG. 4. The method 113 is an example of the training routine.

At a point 115, an IP RF signal 119 of the IP RF generator (e.g., 2 MHz generator) is pulsed high to a high power set point. In the example of FIG. 3, the high power set point for the 2 MHz IP RF generator is 6 kilowatts (kW). This is also shown in an operation 117 of FIG. 4.

Further, the dependent RF generator (e.g., 60 MHz generator) is set to its frequency self-tuning mode to allow the dependent RF generator to converge to an optimal RF frequency for power delivery when the IP RF signal 119 is pulsed high. This is also shown in the operation 117 of FIG. 4. To elaborate, the independent or dependent RF generator monitors many variables associated with the plasma chamber 102 and adjusts its own variables to maximize power delivery to the plasma chamber 102. The independent or dependent RF generator then tunes its RF signal frequency to minimize gamma, thereby maximizing power delivery efficiency.

The IP RF signal of 2 MHz is pulsed high during the period between points 115 and 121. This high pulse duration of the IP RF signal is greatly extended during the training time, e.g., from tenths of seconds up to multiple of seconds relative to an IP RF signal high pulse duration employed during production time for processing of the substrate 108. The substrate 108 may be processed to etch the substrate 108, to deposit one or more layers on the substrate 108, to clean the substrate 108, etc. This artificially extended high pulse duration gives the dependent RF generator enough time to optimally tune its frequency to maximize power delivery efficiency for the plasma impedance condition that exists when the IP RF signal is pulsed high.

The dependent RF generator tunes to a frequency value of 61.3 MHz for a gamma value of 0.04 when the 2 MHz IP RF signal pulses high. This optimal tuned RF frequency of 61.3 MHz, e.g., IDPC_Freq1, for the dependent RF generator is then recorded within the AFT 118 (FIG. 1) as illustrated in operation 123 and is set as the IDPC_Freq1 as illustrated in an operation 125 of FIG. 4. The IDPC_Freq1 is an example of the frequency value F21. Forward power, e.g., 6 kW, etc., sensed by the sensor 212 at the frequency IDPC_Freq1 is an example of the power value P21. This 61.3 MHz value represents the optimal RF frequency for the 60 MHz dependent RF signal when the 2 MHz IP RF signal pulses high. The gamma value of 0.04 verifies that power delivery is efficient at this optimal tuned RF frequency for the dependent RF generator.

The dependent RF generator is then operated in the fixed frequency mode whereby its RF frequency is not allowed to tune. Instead, the dependent RF generator is forced to operate at the aforementioned 61.3 MHz optimal tuned RF frequency and the 2 MHz IP RF signal transitions from its high power set point to its low power set point (from 121 to 127). This can be seen in an operation 131 of FIG. 4. Although the low power set point for the 2 MHz RF signal is zero in the example of FIG. 2, in an embodiment, the low power set point may be any power level setting that is lower than the high power set point of 6 kW.

After the IP RF signal pulses low (after point 127), the previous optimal tuned RF frequency of 61.3 MHz is no longer efficient RF frequency for power delivery by the dependent RF generator. This is because the plasma impedance has changed when the 2 MHz IP RF signal pulses low to deliver a lower amount of RF power to the plasma within the plasma chamber 102. The inefficiency is reflected in a gamma value of 0.8, which is detected by the sensor 212 of the dependent RF generator. This gamma value of 0.8 is recorded in an operation 133 of FIG. 4 and may be set as an IDPC_Gamma1 threshold in an operation 135 of FIG. 4. The IDPC_Gamma1 threshold is an example of the second threshold. The IDPC_Gamma1 threshold is stored within a memory device of the DSP 150, a memory device of the AFT 120, and/or a memory device of the power controller 154 (FIG. 1).

During production time, as the IP RF signal is pulsed high and the 60 MHz RF signal is at 61.3 MHz and the IDPC_Gamma1 threshold is subsequently encountered, the dependent RF generator determines that the 2 MHz IP RF signal has just transitioned from high to low.

In one or more embodiments, the IDPC_Gamma1 threshold can be adjusted for sensitivity by a Threshold 1 Adjust value. For example, it may be desirable to set in the operation 135 the IDPC_Gamma1 threshold at 0.7 instead of 0.8, e.g., slightly below a gamma value that exists due to the high-to-low transition of the 2 MHz IP RF signal, to increase the high-to-low detection sensitivity by the sensor 212. In this example, the Threshold 1 Adjust value is −0.1, and the IDPC_Gamma1 threshold of 0.7 is the sum of the gamma value of 0.8 and the Threshold 1 Adjust value of −0.1.

Once the IDPC_Gamma1 threshold is obtained, the 60 MHz dependent RF generator is set to the frequency self-tuning mode in an operation 139 to enable the 60 MHz dependent RF generator to determine an optimal tuned RF frequency for power delivery when the 2 MHz IP RF signal pulses low. Again, the low pulse of the 2 MHz IP RF signal is artificially extended between points 127 and 137 of FIG. 3 to enable both an ascertainment of the IDPC_Gamma1 threshold and to permit the 60 MHz dependent RF generator to self-tune to an optimal RF frequency for power delivery during the low pulse of the 2 MHz IP RF signal.

Once the dependent RF generator tunes to the optimal RF frequency, e.g., 60.5 MHz, for power delivery during the low pulse of the 2 MHz IP RF signal, the optimal tuned RF frequency of the dependent RF generator is recorded in an operation 141 and is set as IDPC_Freq2 in an operation 143.

After the dependent RF generator has tuned to its optimal RF frequency value, e.g., 60.5 MHz, etc., for the low pulse of the 2 MHz IP RF signal, the dependent RF generator is set to operate in a fixed frequency mode in an operation 145 at an IDPC_Freq2 and the 2 MHz IP RF generator is allowed to pulse high, e.g., transition from the point 137 to a point 147. The IDPC_Freq2 is an example of the frequency value F20. Forward power sensed by the sensor 212 at the frequency IDPC_Freq2 is an example of the power value P20. This can also be seen in the operation 145 of FIG. 4.

After the 2 MHz IP RF signal pulses high, e.g., after point 137, the previous optimal tuned RF frequency IDPC_Freq2 is no longer the efficient RF frequency for power delivery by the 60 MHz RF generator. This is because the plasma impedance has changed when the 2 MHz independently pulsing RF signal pulses high to deliver a higher amount of RF power to the plasma within the plasma chamber 102. The inefficiency is reflected in a gamma value of 0.78, which is detected by the sensor 212. This gamma value of 0.78 is recorded in an operation 151 and may be set as an IDPC_Gamma2 threshold in an operation 153. THE IDPC_Gamma2 threshold is an example of the first threshold. The IDPC_Gamma2 threshold is stored within a memory device of the DSP 150, a memory device of the AFT 118, and/or a memory device of the power controller 152.

During production time as the IP RF signal is pulsed low and the 60 MHz RF signal is at 60.5 MHz, which is the optimal tuned RF frequency for the 60 MHz RF generator when the IP RF signal is pulsed low, and the IDPC_Gamma2 threshold is subsequently encountered, the dependent RF generator determines that the 2 MHz IP RF signal has just transitioned from low to high.

In one or more embodiments, the IDPC_Gamma2 threshold can be adjusted for sensitivity by a Threshold2 Adjust value. For example, it may be desirable to set at the operation 153 of FIG. 4 the IDPC_Gamma2 threshold at 0.75 instead of 0.78, e.g., slightly below the true gamma value that exists due to the low-to-high transition of the 2 MHz IP RF signal, to increase the low-to-high detection sensitivity by the sensor 212. In this example, the Threshold2_Adjust value is −0.03, and the IDPC Gamma2 threshold of 0.75 is the sum of the gamma value of 0.78 and the Threshold2 Adjust value of −0.03.

The two optimal tuned RF frequencies values, e.g., 61.3 MHz and 60.5 MHz, and the two gamma threshold values, e.g., IDPC_Gamma1 threshold and IDPC_Gamma2 threshold, are then employed during production time when the 2 MHz is allowed to pulse and the 60 MHz dependent RF generator flips back and forth between the two previously learned optimal tuned RF frequencies when the sensor 212 detects that a gamma value has exceeded the thresholds. The 60 MHz signal is illustrated as a signal 155 in FIG. 3.

Figure 5:
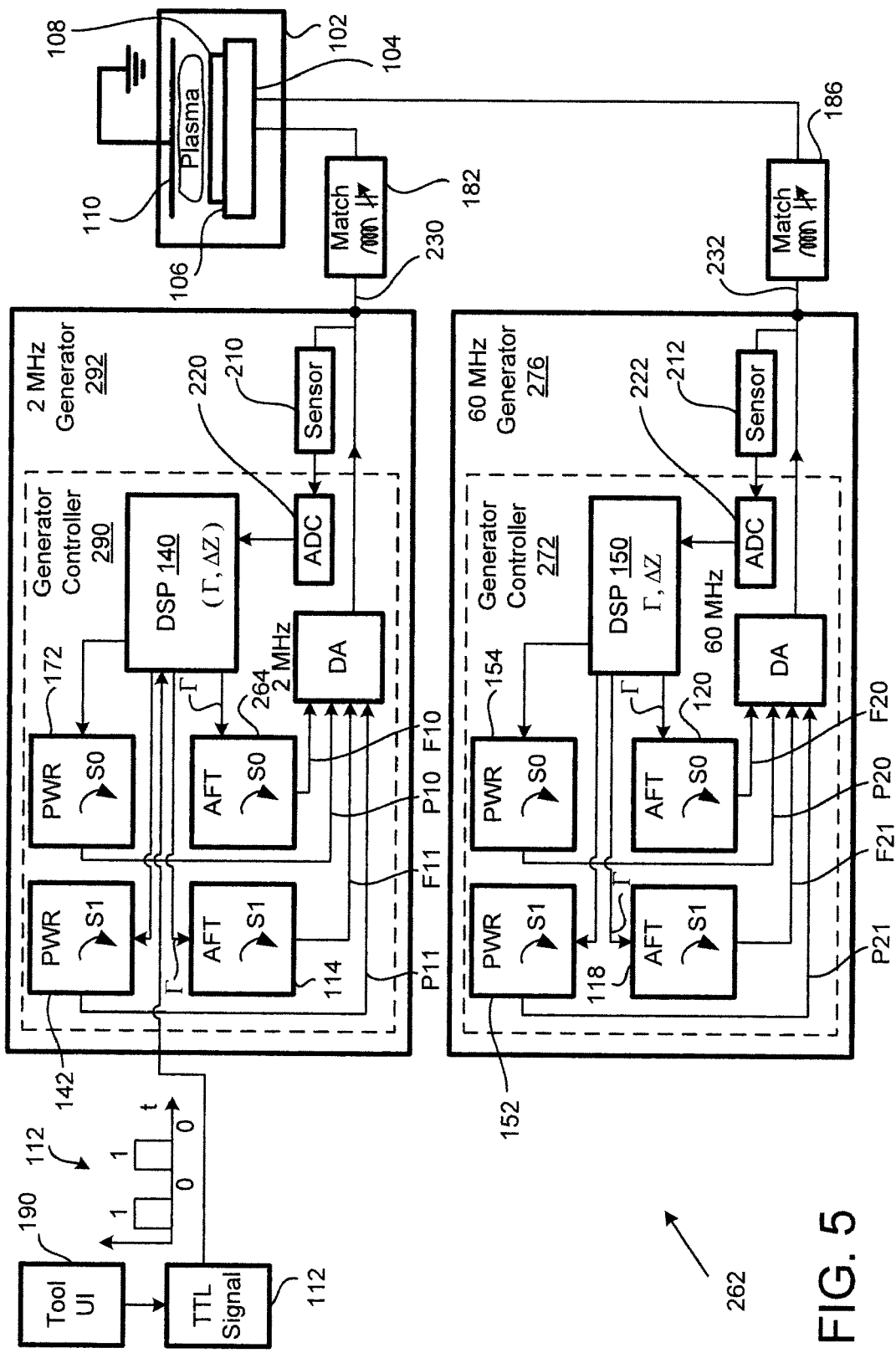
FIG. 5 is a diagram of an embodiment of a system for changing a state based on plasma impedance, where the power controllers and/or the frequency tuners provide non-zero values, in accordance with an embodiment described in the present disclosure.

FIG. 5 is a diagram of an embodiment of a system 262 for changing a state based on plasma impedance, where the power controllers and/or the frequency tuners provide non-zero values. The system 262 is similar to the system 180 of FIG. 1 except that the system 262 includes a power controller 172 and an AFT 264, each of which provide non-zero values.

The DSP 140 provides the identified state S0 from a corresponding memory location to the AFT 264 and to the power controller 172. As an example, the DSP 140 indicates to the AFT 264 and the power controller 172 that the TTL signal 112 is in the state S0 between times t2 and t3 of a duty cycle. The AFT 264 determines a frequency value based on a state of the TTL signal 112 and the power controller 172 determines a power value based on the state of the TTL signal 112. For example, the AFT 264 determines that a frequency value F10 is to be provided to the 2 MHz DA system when the state of the TTL signal 112 is S0 and the power controller 172 determines that a power value P10 is to be provided to the 2 MHz DA system when the state of the TTL signal 112 is S0. In one embodiment, the values F10 and P10 are positive values.

The frequency value F10 is stored in the AFT 264 and the power value P10 is stored in the power controller 172. When the state of the TTL signal 112 is S0, the power controller 172 provides the power value of P10 to the 2 MHz DA system and the AFT 264 provides the frequency value of F10 to the 2 MHz DA system.

The 2 MHz DA system receives the frequency value of F10 and the power value of P10 during the state S0. Upon receiving the values F10 and P10, the 2 MHz DA system generates RF power at the frequency F10 and the RF power has the power value of P10. The amplifier of the 2 MHz DA system supplies forward power having a power value that is proportional to the power value P10 and having the frequency value F10 via the transmission line 230 and the impedance matching circuit 182 to the plasma chamber 102.

In an embodiment, during the state S0 of the TTL signal 112, the AFT 264 determines a frequency value based on the value of gamma received from the DSP 140. During the state S0, the AFT 264 adjusts the frequency value of F10 based on the frequency value that is generated from the gamma value and provides the adjusted frequency value to the 2 MHz DA system. Moreover, during the state S0, the power controller 172 determines a power value based on the value of gamma received from the DSP 140. During the state S0, the power controller 172 adjusts the power value of P10 based on the power value that is generated based on the gamma value and provides the adjusted power value to the 2 MHz DA system. Also, during the state S0, the 2 MHz DA system generates a power signal having the adjusted frequency value received from the AFT 264 and having the adjusted power value received from the power controller 172, and supplies the power signal via the impedance matching circuit 182 to the plasma chamber 102.

The power controllers 142 and 172, the AFTs 114 and 264, and the DSP 140 are parts of a generator controller 290. The generator controller 290, the ADC 220, the sensor 210, and the 2 MHz DA system are parts of a 2 MHz generator 292.

In one embodiment, instead of each DSP 140 or 150, any number of processors is used to perform the functions performed by the DSP.

Figure 6A:
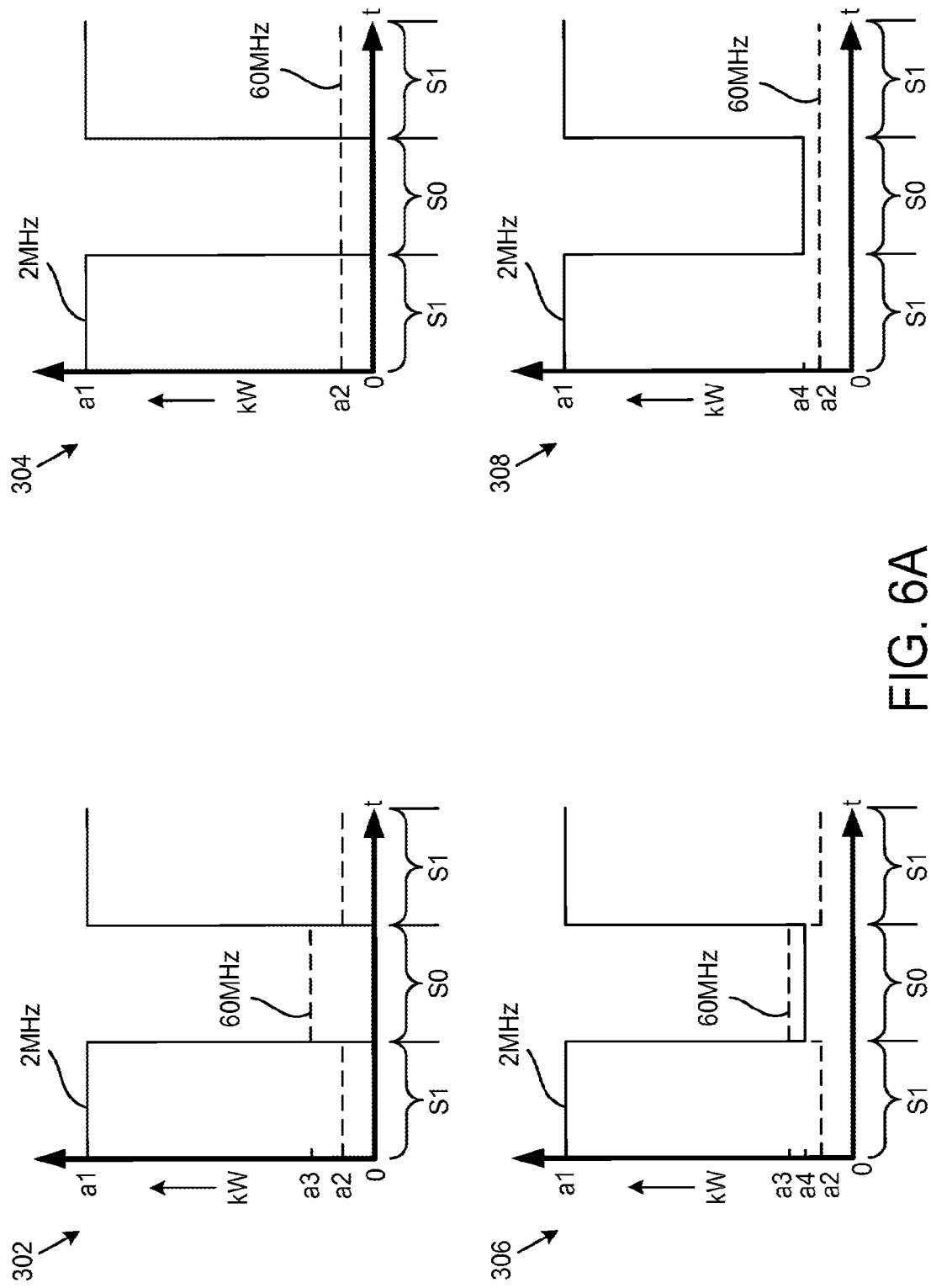
FIG. 6A shows graphs with two radio frequency (RF) signals in which one of the RF signals has a constant value or varying values, in accordance with an embodiment described in the present disclosure.

FIG. 6A shows embodiments of graphs 302, 304, 306, and 308. Each graph 302, 304, 306, and 308 plots power values in kilowatts (kW) as a function of time t. As indicated in graph 302, a 2 MHz power signal, which is a power signal supplied by the 2 MHz DA system has a power value of a1 during the state S1 and has a power value of 0 during the state S0. The power value a1 is an example of the power value P11. Also, a 60 MHz power signal, which is a power signal supplied by the 60 MHz DA system has a power value of a2 during the state S1 and has a power value of a3 during the state S0. The power value of a2 is an example of the power value P21 and the power value of a3 is an example of the power value P20.

As indicated in the graph 304, the 60 MHz power signal has the power value a2 during states S1 and S0. Moreover, as indicated in graph 306, the 2 MHz signal has a power value of a4 during the state S0. The power value a4 is an example of the power value P10. As indicated in graph 308, the 60 MHz signal has the power value of a2 when the 2 MHz signal has the power value of a4.

Figure 6B:
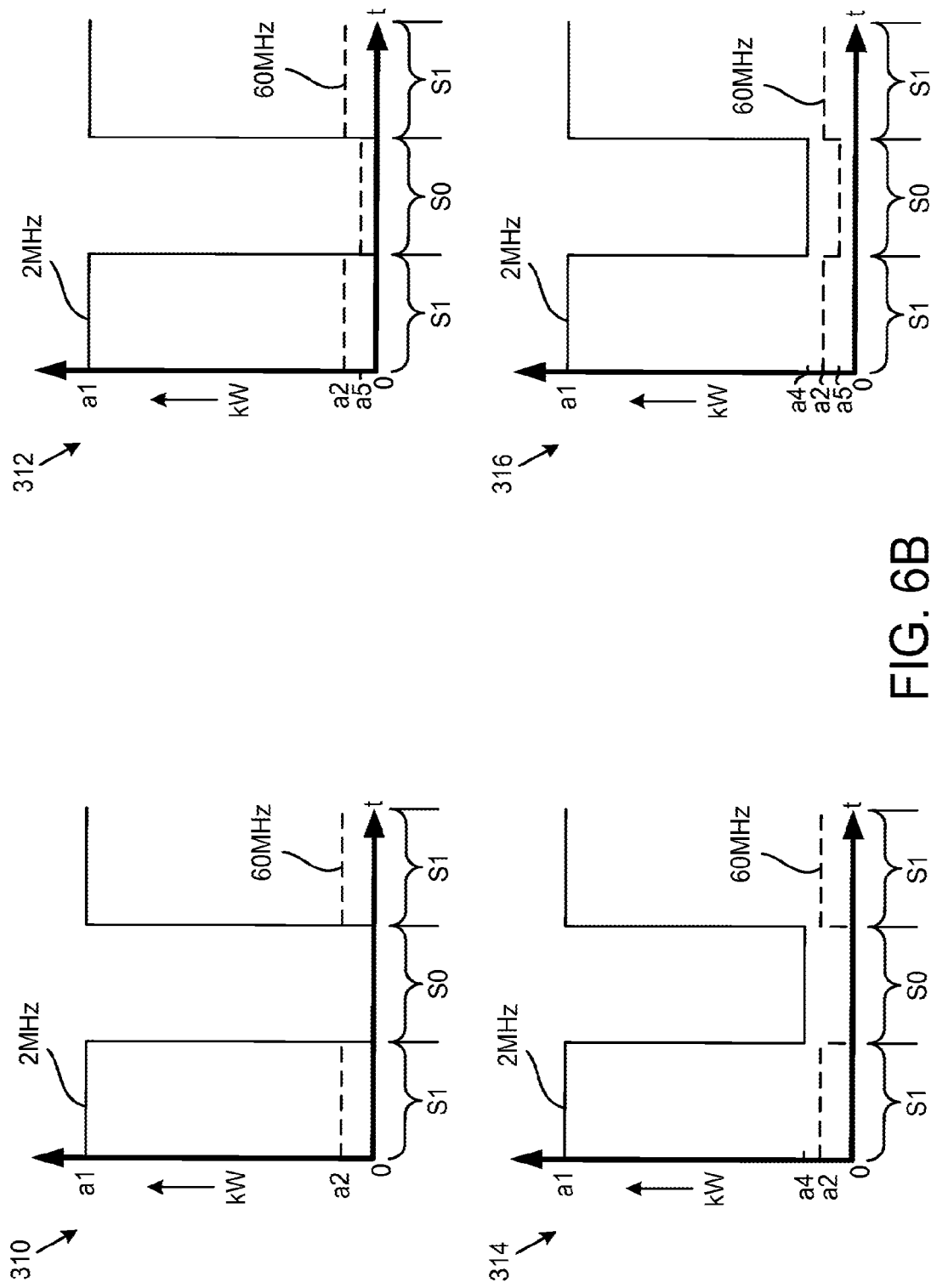
FIG. 6B shows graphs with two RF signals in which both the RF signals have varying values, in accordance with an embodiment described in the present disclosure.

FIG. 6B shows embodiments of graphs 310, 312, 314, and 316. Each graph 310, 312, 314, and 316 plots power values in kilowatts as a function of time t. As shown in graph 310, instead of the 60 MHz signal transitioning from the power value of a2 to the power value of a3 (FIG. 6A), the 60 MHz signal transitions from the power value of a2 to a power value of zero.

Moreover, as shown in graph 312, the 60 MHz signal transitions from the power value of a2 to a power value of a5, which is an example of the power value P20. As shown in graph 314, the 60 MHz signal has the power value of zero during the state S0 when the 2 MHz signal has a non-zero power value of a4. As shown in graph 316, the 60 MHz power signal has a non-zero power value of a5 during the state S0 when the 2 MHz signal has a non-zero power value of a4.

Figure 7A:
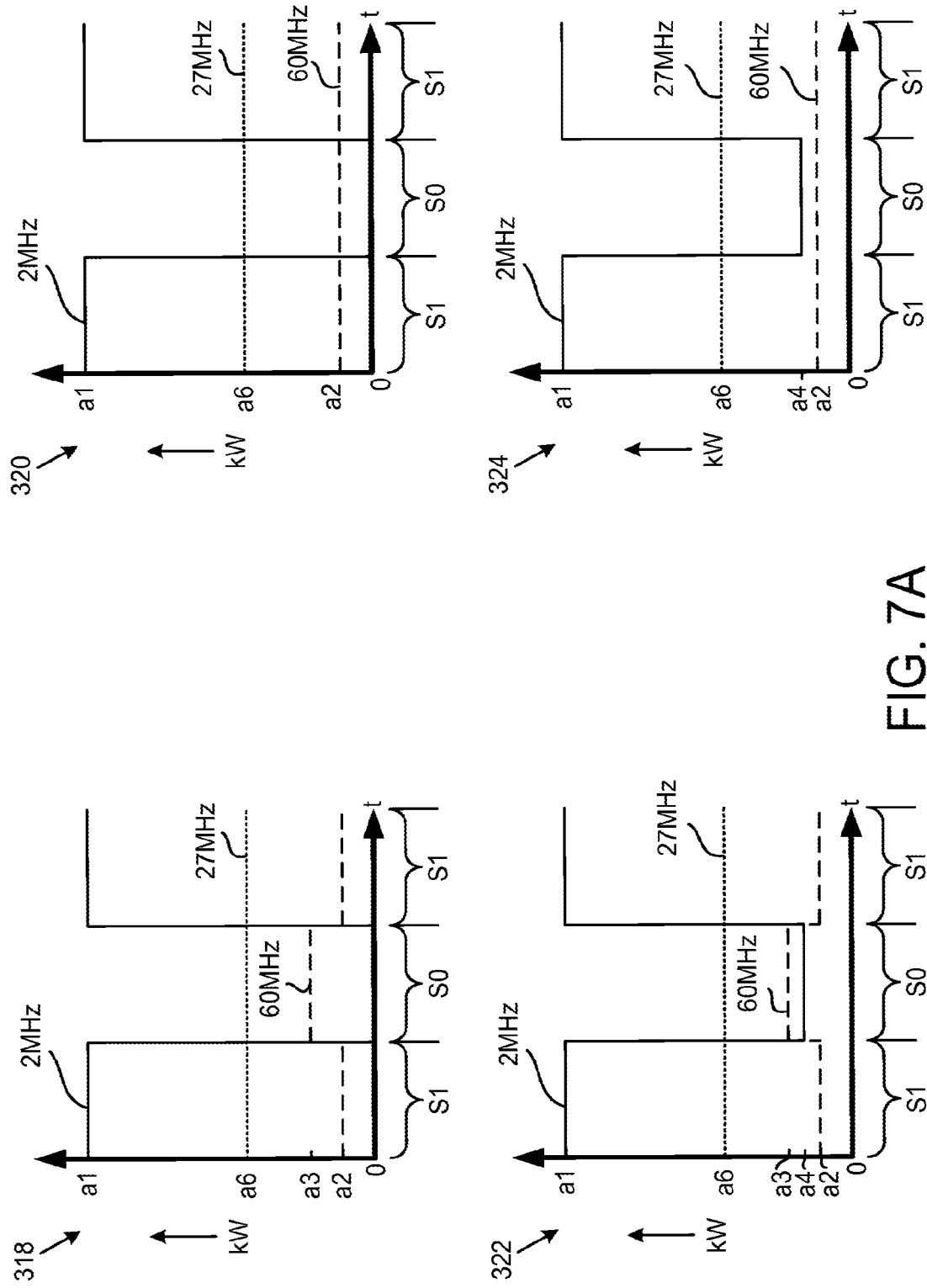
FIG. 7A shows graphs with three RF signals in which one of the RF signals has a constant value and another one of the RF signals has a constant value or varying values, in accordance with an embodiment described in the present disclosure.

FIG. 7A shows embodiments of graphs 318, 320, 322, and 324. Each graph 318, 320, 322, and 324 plots power values in kilowatts as a function of time t. Graph 318 is similar to graph 302 (FIG. 6A), graph 320 is similar to graph 304 (FIG. 6A), graph 320 is similar to graph 306 (FIG. 6A), and graph 322 is similar to graph 308 (FIG. 6A) except that the graphs 318, 320, 322, and 324 include a plot of a 27 MHz signal. The 27 MHz signal is generated from a 27 MHz DA system (not shown) of the 27 MHz generator. The 27 MHz signal is an RF signal having a power value of a6 during both states S1 and S0.

Figure 7B:
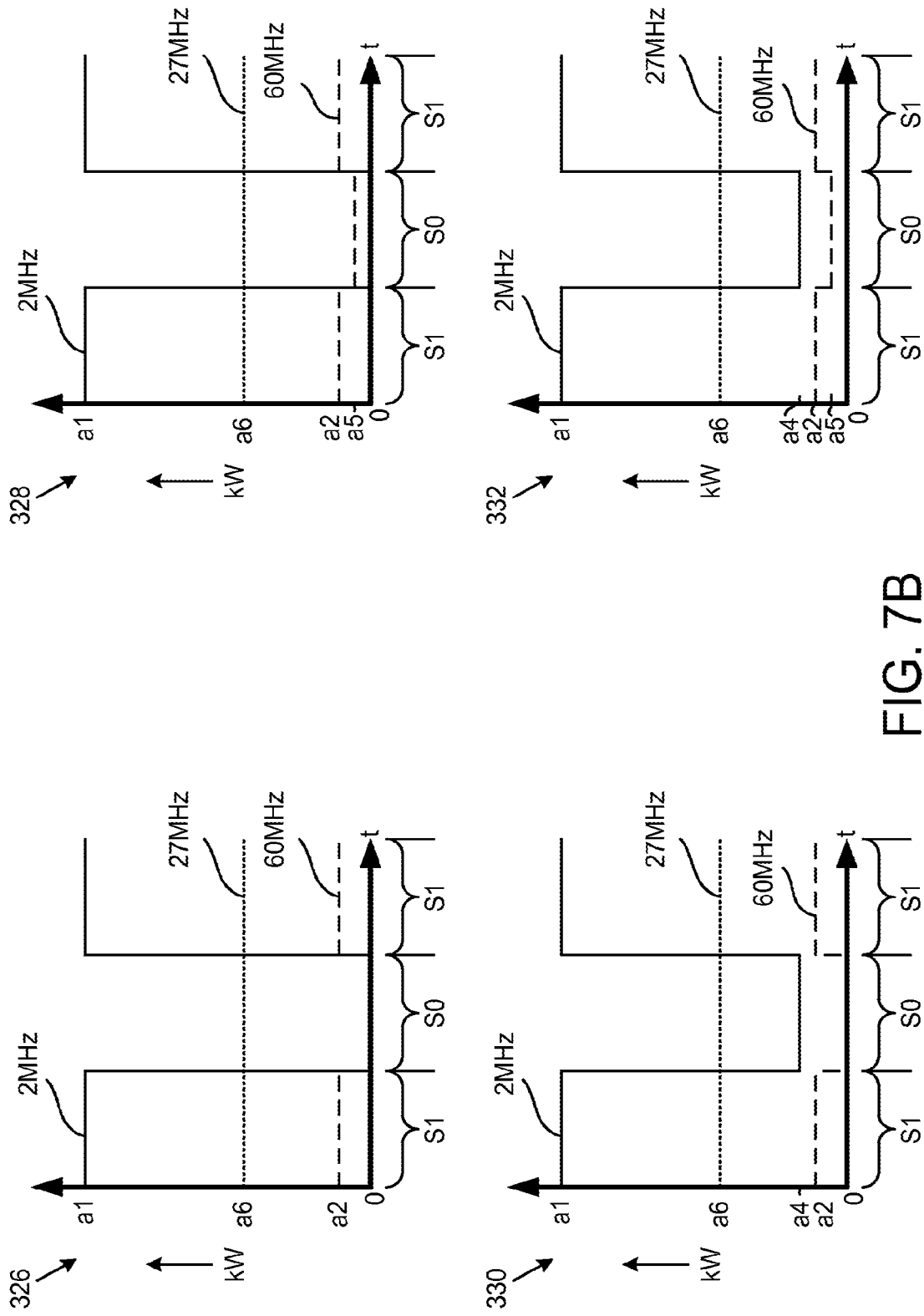
FIG. 7B shows graphs with three RF signals in which one of the RF signals a constant value and the remaining two RF signals have varying values, in accordance with an embodiment described in the present disclosure.

FIG. 7B shows embodiments of graphs 326, 328, 330, and 332. Each graph 326, 328, 330, and 332 plots power values in kilowatts as a function of time t. Graph 326 is similar to graph 310 (FIG. 6B), graph 328 is similar to graph 312 (FIG. 6B), graph 330 is similar to graph 314 (FIG. 6B), and graph 332 is similar to graph 316 (FIG. 6B) except that the graphs 326, 328, 330, and 332 include a plot of a 27 MHz signal that has the power value of a6.

Figure 7C:
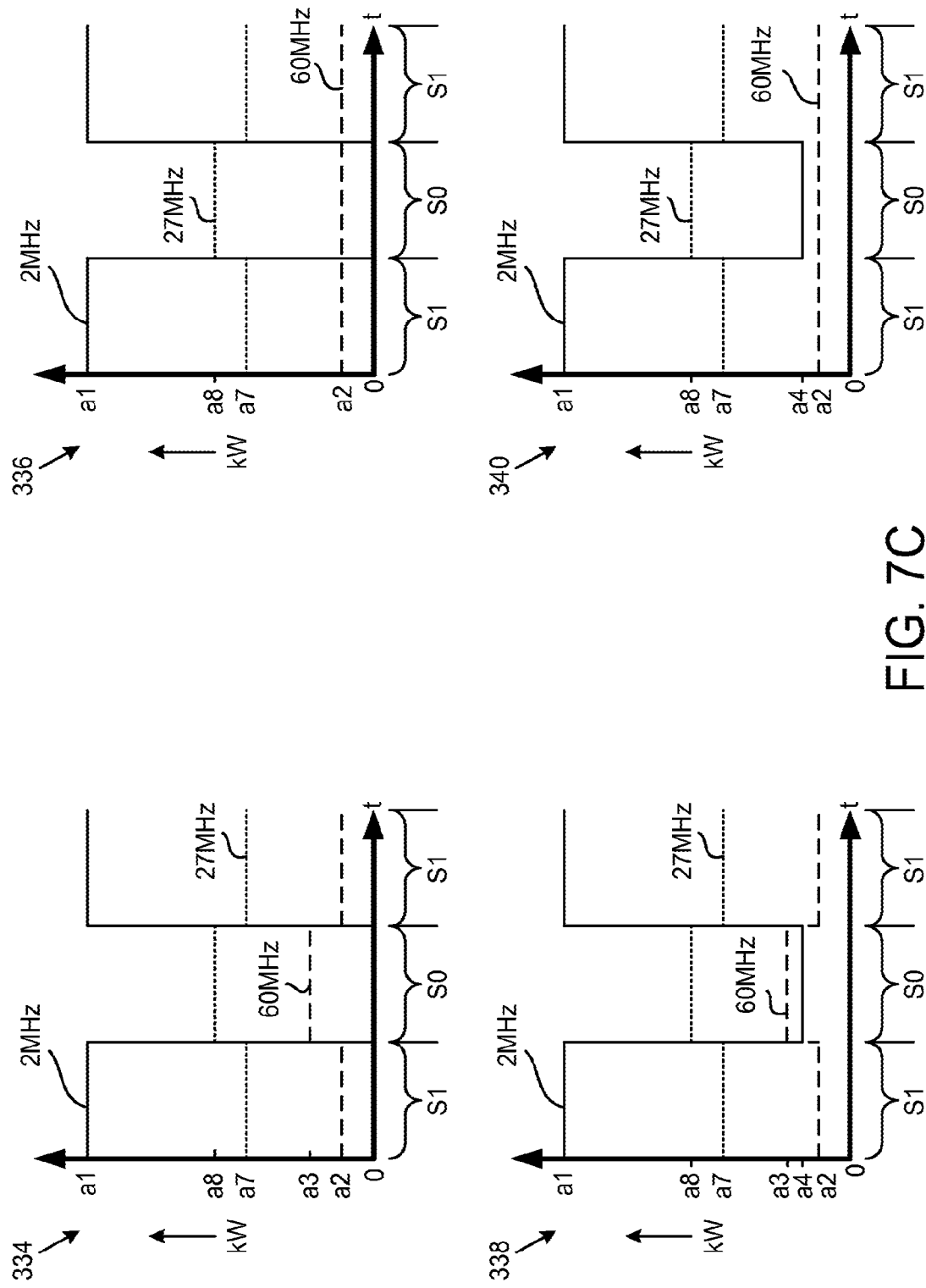
FIG. 7C shows graphs with three RF signals in which one of the RF signals has a constant value or varying values and the remaining two RF signals have varying values, in accordance with an embodiment described in the present disclosure.

FIG. 7C shows embodiments of graphs 334, 336, 338, and 340. Each graph 334, 336, 338, and 340 plots power values in kilowatts as a function of time t. Graph 334 is similar to graph 302 (FIG. 6A), graph 336 is similar to graph 304 (FIG. 6A), graph 338 is similar to graph 306 (FIG. 6A), and graph 340 is similar to graph 308 (FIG. 6A) except that the graphs 334, 336, 338, and 340 include a plot of a 27 MHz signal. The 27 MHz signal transitions from having a power value of a7 during the state S1 to having a power value of a8 during the state S0. The power value a7 is less than the power value a8.

Figure 7D:
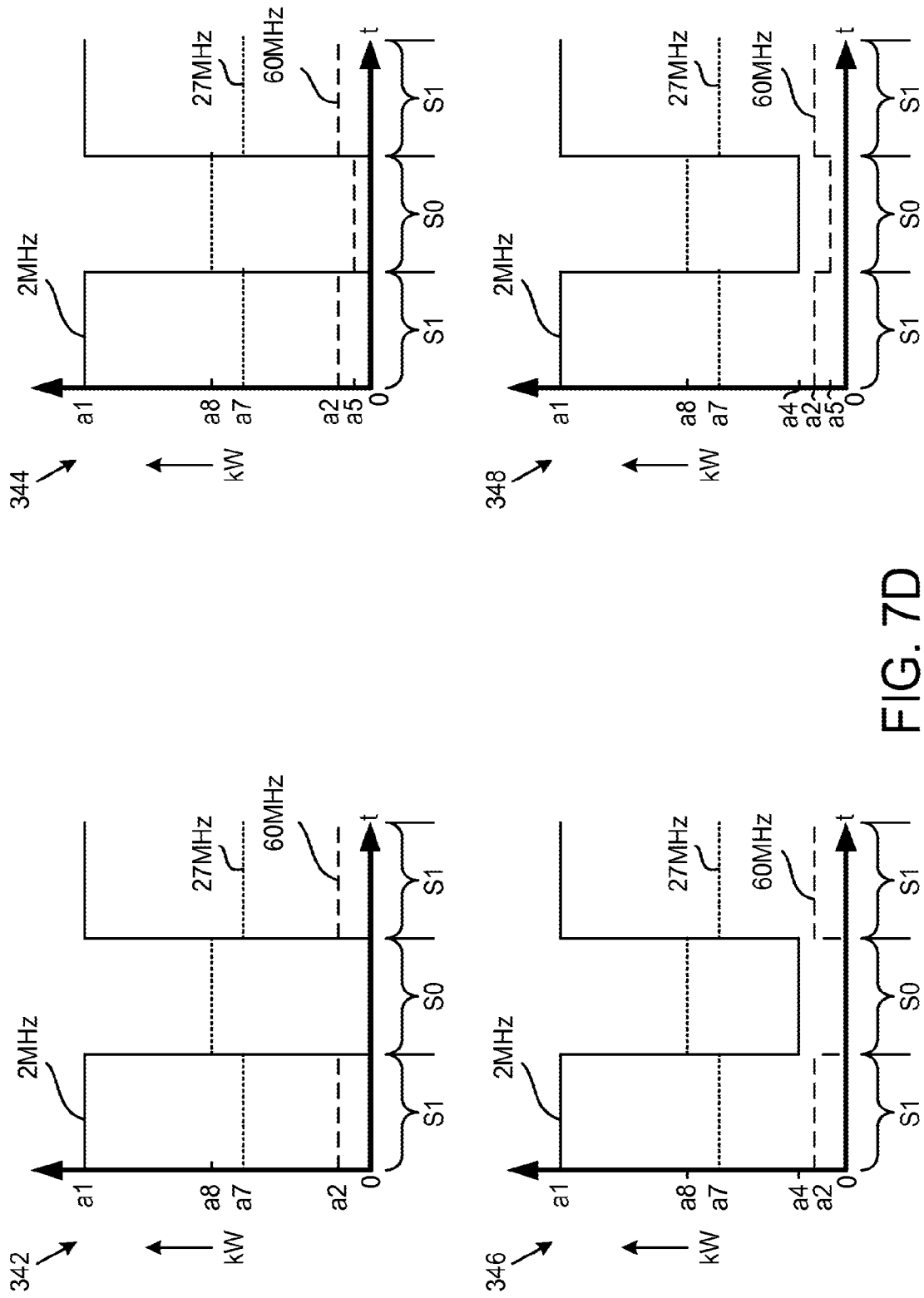
FIG. 7D shows graphs with all three RF signals have varying values, in accordance with an embodiment described in the present disclosure.

FIG. 7D shows embodiments of graphs 342, 344, 346, and 348. Each graph 342, 344, 346, and 348 plots power values in kilowatts as a function of time t. Graph 342 is similar to graph 310 (FIG. 6B), graph 344 is similar to graph 312 (FIG. 6B), graph 346 is similar to graph 314 (FIG. 6B), and graph 348 is similar to graph 316 (FIG. 6B) except that the graphs 342, 344, 346, and 348 include a plot of a 27 MHz signal that has the power values of a7 and a8.

Figure 7E:
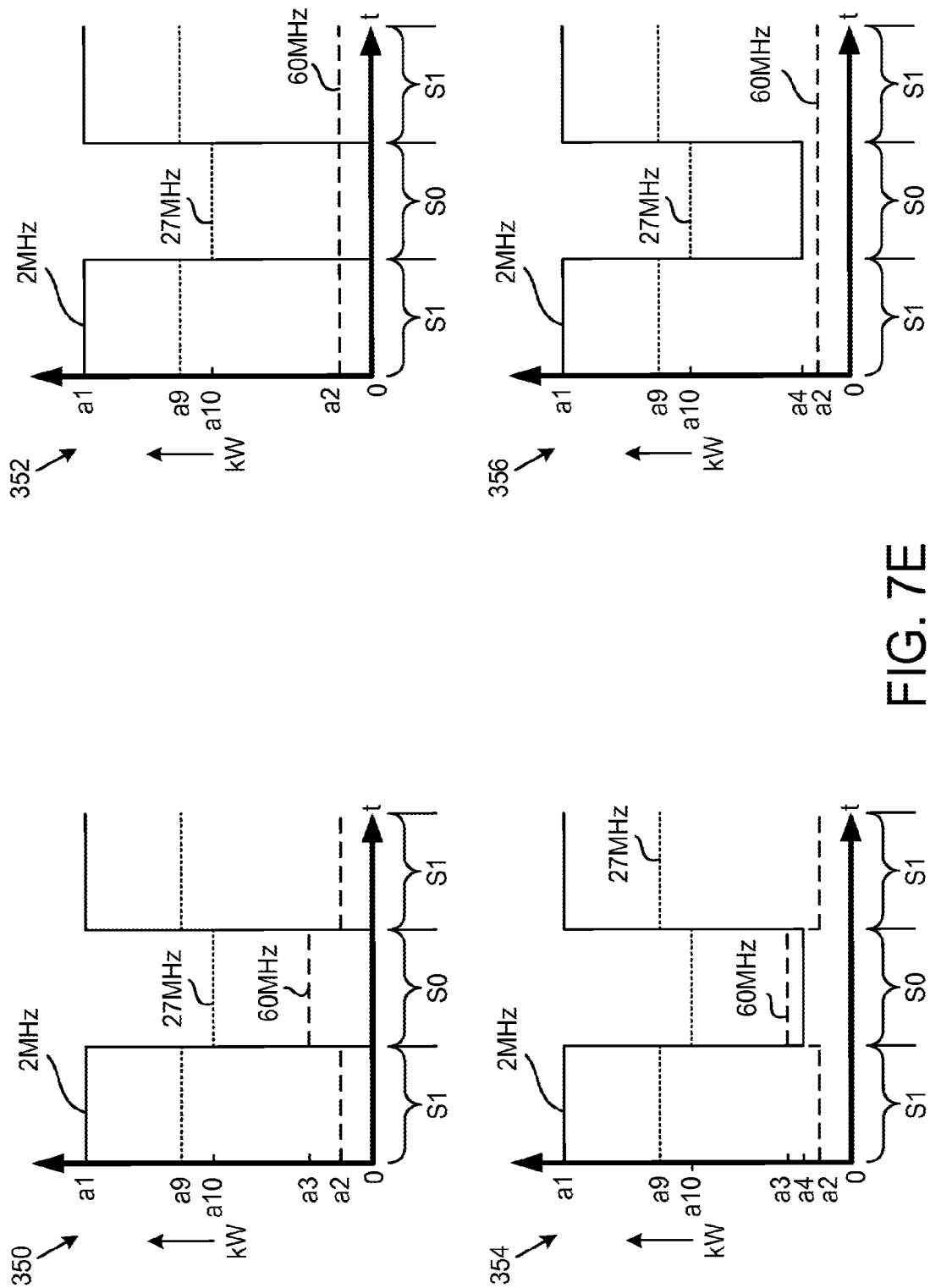
FIG. 7E shows graphs with three RF signals in which one of the RF signals has a constant value or varying values and the remaining RF signals have varying values, in accordance with an embodiment described in the present disclosure.

FIG. 7E shows embodiments of graphs 350, 352, 354, and 356. Each graph 350, 352, 354, and 356 plots power values in kilowatts as a function of time t. Graph 350 is similar to graph 302 (FIG. 6A), graph 352 is similar to graph 304 (FIG. 6A), graph 354 is similar to graph 306 (FIG. 6A), and graph 356 is similar to graph 308 (FIG. 6A) except that the graphs 350, 352, 354, and 356 include a plot of a 27 MHz signal. The 27 MHz signal transitions from having a power value of a9 during the state S1 to having a power value of a10 during the state S0. The power value a9 is greater than the power value a10.

Figure 7F:
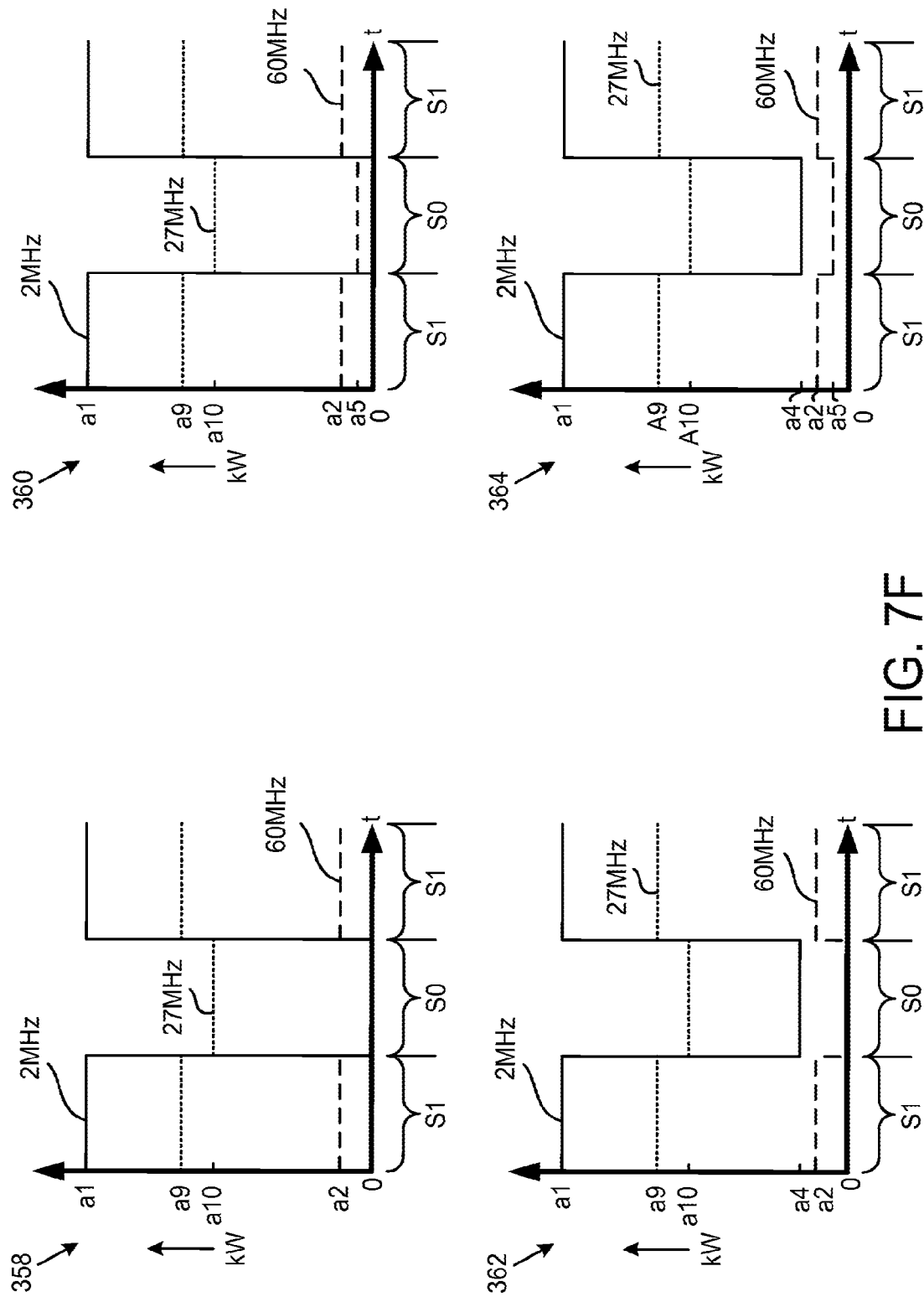
FIG. 7F shows graphs with all three RF signals have varying values, in accordance with an embodiment described in the present disclosure.

FIG. 7F shows embodiments of graphs 358, 360, 362, and 364. Each graph 358, 360, 362, and 364 plots power values in kilowatts as a function of time t. Graph 358 is similar to graph 310 (FIG. 6B), graph 360 is similar to graph 312 (FIG. 6B), graph 362 is similar to graph 314 (FIG. 6B), and graph 364 is similar to graph 316 (FIG. 6B) except that the graphs 358, 360, 362, and 364 include a plot of a 27 MHz signal that has the power values of a9 and a10.

It should be noted that in the graphs 302, 304, 306, 308, 310, 312, 314, 316, 318, 320, 322, 324, 326, 328, 330, 332, 334, 336, 338, 340, 342, 344, 346, 348, 350, 352, 354, 356, and 358 shown above, the 2 MHz signal is shown as a solid line, the 60 MHz signal is shown as a dashed line, and the 27 MHz signal is shown as a dotted line.

Figure 8:
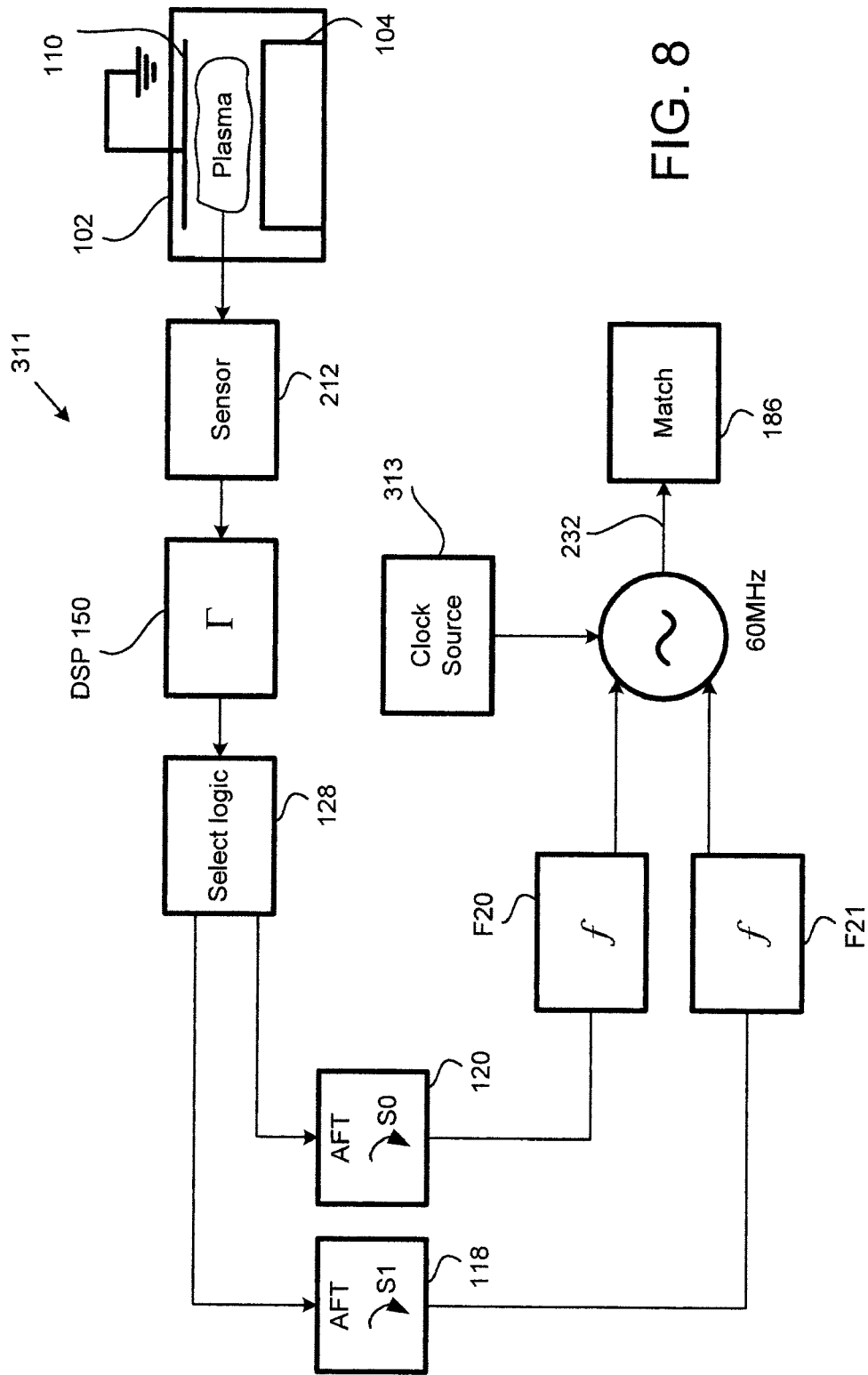
FIG. 8 is a block diagram of an embodiment of a system for selecting between auto frequency tuners (AFTs) based on whether a gamma value is greater than a first threshold or a second threshold, in accordance with an embodiment described in the present disclosure.

FIG. 8 is a block diagram of an embodiment of a system 311 for selecting between AFTs 118 and 120 (FIGS. 1 and 3) based on whether a gamma value is greater than the first threshold or the second threshold. When the TTL signal 112 is in the state S1 and a gamma value measured during the state S1 exceeds the first threshold, a select logic 128, which is an example of a selector, of the system 311 selects the AFT 118 and when the TTL signal 112 is in the state S0 and a gamma value measured during the state S0 exceeds the second threshold, the select logic 128 selects the AFT 120. Examples of the select logic 128 include a multiplexer. When the select logic 128 includes the multiplexer, a signal indicating that a gamma value measured during the state S1 of the TTL signal 112 is greater than the first threshold or a signal indicating that a gamma value measured during the state S0 of the TTL signal 112 is greater than the second threshold is received at a select input of the multiplexer. The DSP 150 generates a signal indicating a gamma value measured during the state S1 of the TTL signal 112 is greater than the first threshold and provides the signal to the multiplexer when the TTL signal 112 has the state S1. The DSP 150 generates a signal indicating that a gamma value measured during the state S0 of the TTL signal 112 is greater than the second threshold and provides the signal to the multiplexer when the TTL signal 112 has the state S0.

In one embodiment, the select logic 128 includes a processor. In an embodiment, the select logic 128 is implemented within the DSP 140.

When the AFT 118 is selected, the AFT 118 provides the frequency value F21 to the 60 MHz DA system. Similarly, when the AFT 120 is selected, the AFT 120 provides the frequency value F20 to the 60 MHz DA system.

The 60 MHz DA system generates the 60 MHz signal synchronous with a clock signal that is received from a clock source 313. In one embodiment, the clock signal of the clock source 313 is asynchronous with the TTL signal 112. In an embodiment, the clock signal of the clock source 313 is synchronous with the TTL signal 112.

In one embodiment, the select logic 128 selects between the power controllers 152 and 154 (FIG. 5) instead of the AFTs 118 and 120. When the power controller 152 is selected during the state S1 of the TTL signal 112, the power controller 152 provides the power value P21 to the 60 MHz DA system and when the power controller 154 is selected ruing the state S0 of the TTL signal 112, the power controller 154 provides the power value P20 to the 60 MHz DA system.

In one embodiment, the select logic 128 is implemented within the 27 MHz generator in a similar manner in which the select logic 128 is implemented within the 60 MHz generator 276 (FIGS. 1 and 3).

A value of gamma is transferred by the select logic 128 to AFT 118 or 120 based on the state S1 or S0. For example, when the state is S1, the DSP 150 provides the first gamma value to the select logic 128. In this example, the select logic 128 that has selected the AFT 118 during the state S1 transfers the first gamma value received from the DSP 150 to the AFT 118. As another example, when the state is S0, the DSP 150 provides the second gamma value to the select logic 128. In this example, the select logic 128 that has selected the AFT 120 during the state S0 transfers the second gamma value received from the DSP 150 to the AFT 120.

Similarly, in the embodiments in which the power controllers 152 and 154 (FIG. 5) are used, the select logic 128 transfers the first gamma value received from the DSP 150 to the power controller 152 during the state S1 and transfers the second gamma value received from the DSP 150 to the power controller 154.

Furthermore, in the embodiment in which the select logic 128 is implemented within the 27 MHz generator and is coupled to power controllers of the 27 MHz generator, the select logic 128 transfers a third gamma value received from a DSP of the 27 MHz generator to one of the power controllers during the state S1 and transfers a fourth gamma value received from the DSP to another one of the power controllers during the state S0. In this embodiment, the third gamma value is generated based on the forward and reflected powers on a transmission line that is coupled to the 27 MHz generator. Also, in this embodiment, both the forward reflected powers are sensed by a sensor of the 27 MHz generator. In this embodiment, the fourth gamma value is generated based on the forward and reflected powers on the transmission line that is coupled to the 27 MHz generator.

Moreover, in the embodiment in which the select logic 128 is implemented within the 27 MHz generator and is coupled to AFTs of the 27 MHz generator, the select logic 128 transfers the third gamma value received from the DSP of the 27 MHz generator to one of the AFTs during the state S1 and transfers the fourth gamma value received from the DSP to the other one of the AFTs during the state S0.

Figure 9:
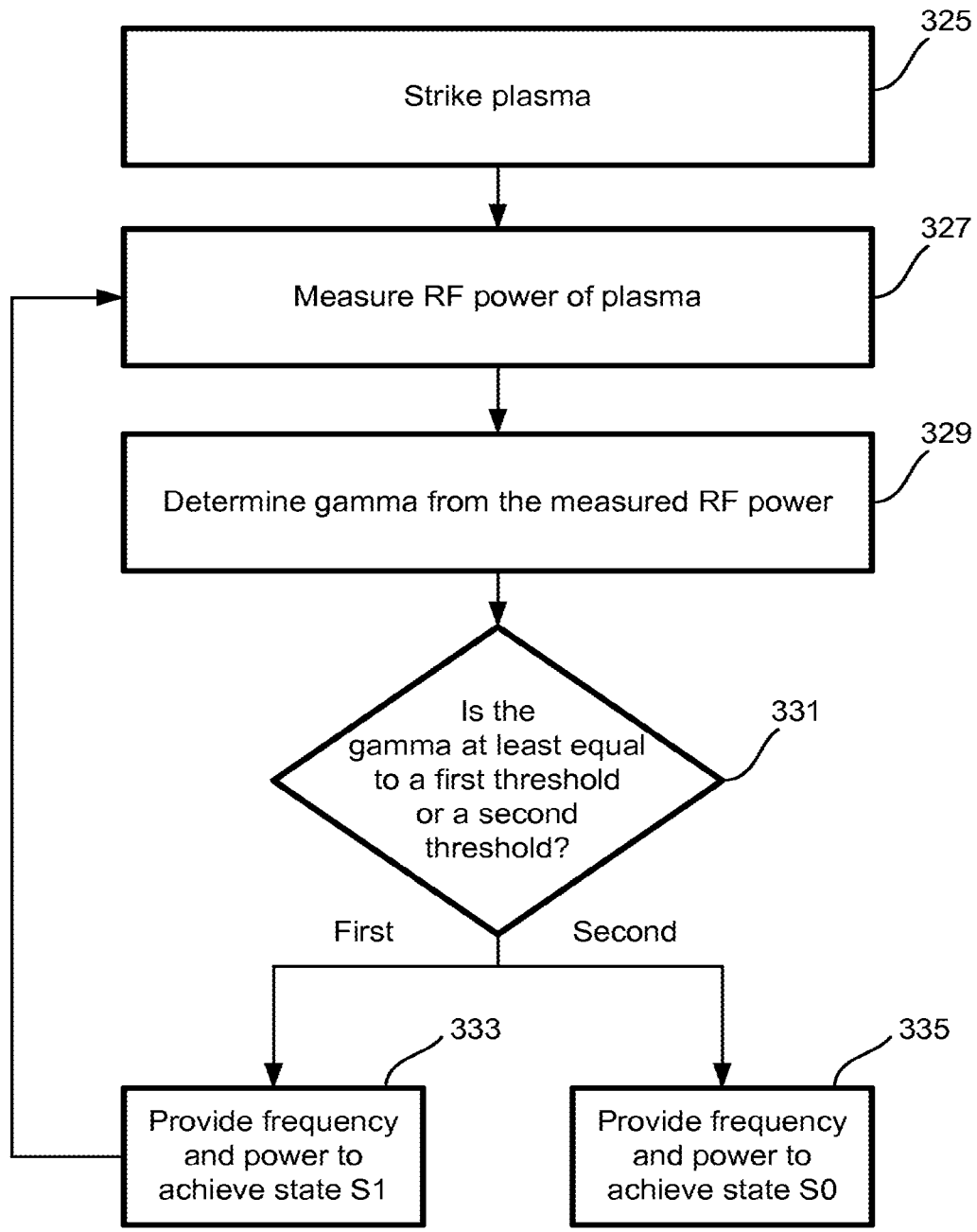
FIG. 9 is a flowchart of an embodiment of a method for adjusting a frequency and/or power of a 60 MHz driver and amplifier to achieve a state S1 or S0 of a 60 MHz generator, in accordance with an embodiment described in the present disclosure.

FIG. 9 is a flowchart of an embodiment of a method 321 for adjusting a frequency and/or power of the 60 MHz DA system to achieve state S1 or S0 of the 60 MHz generator 276 (FIGS. 1 and 3). In an operation 325, plasma is struck, e.g., generated, within the plasma chamber 102 (FIG. 1).

In an operation 327, during both states of the TTL signal 112, forward and reflected powers on the transmission line 232 are measured by the sensor 212 (FIG. 5). The measured forward and reflected powers are converted from an analog format into a digital format.

In an operation 329, the DSPs 140 and 150 calculate gamma values from the digital values of the forward and reflected powers measured during the states S0 and S1 of the TTL signal 112. For each state of the TTL signal 112, a gamma value is determined by a DSP. For example, during the state S0 of the TTL signal 112, a gamma value is determined by the DSP 150 based on a relationship between the forward and reflected power, e.g., a square root of a ratio of reflected power to forward power sensed on the transmission line 232, etc., and during the state S1 of the TTL signal 112, a gamma value is determined by the DSP 150 based on a relationship between the forward and reflected power, e.g., a square root of a ratio of reflected power to forward power sensed on the transmission line 232 (FIG. 5).

In an operation 331, it is determined whether a gamma value measured during the state S1 of the TTL signal 112 is greater than the first threshold and it is determined whether a gamma value measured during the state S0 of the TTL signal 112 is greater than the second threshold. For example, the AFT 118 and the power controller 152 determine whether a gamma value received from the DSP 150 is greater than the first threshold and the AFT 120 and the power controller 154 determine whether a gamma value received from the DSP 150 exceeds the second threshold. As another example, the DSP 150 determines whether the first gamma value is greater than the first threshold or the second gamma value is greater than the second threshold.

Upon determining that the gamma value is greater than the first threshold, in an operation 333, the AFT 118 provides the frequency value F21 to the 60 MHz DA system and the power controller 152 provides the power value P21 to the 60 MHz DA system. Moreover, upon determining that the gamma value is greater than the second threshold, in an operation 335, the AFT 120 provides the frequency value F20 to the 60 MHz DA system and the power controller 154 provides the power value P20 to the 60 MHz DA system. The operation 327 of the method 321 repeats after the operations 333 and 335.

Although the method 321 is described with respect to the 60 MHz generator 276, in one embodiment, the method 321 applies to the 27 MHz generator or a generator with a frequency other than 27 MHz or 60 MHz.

Figure 10:
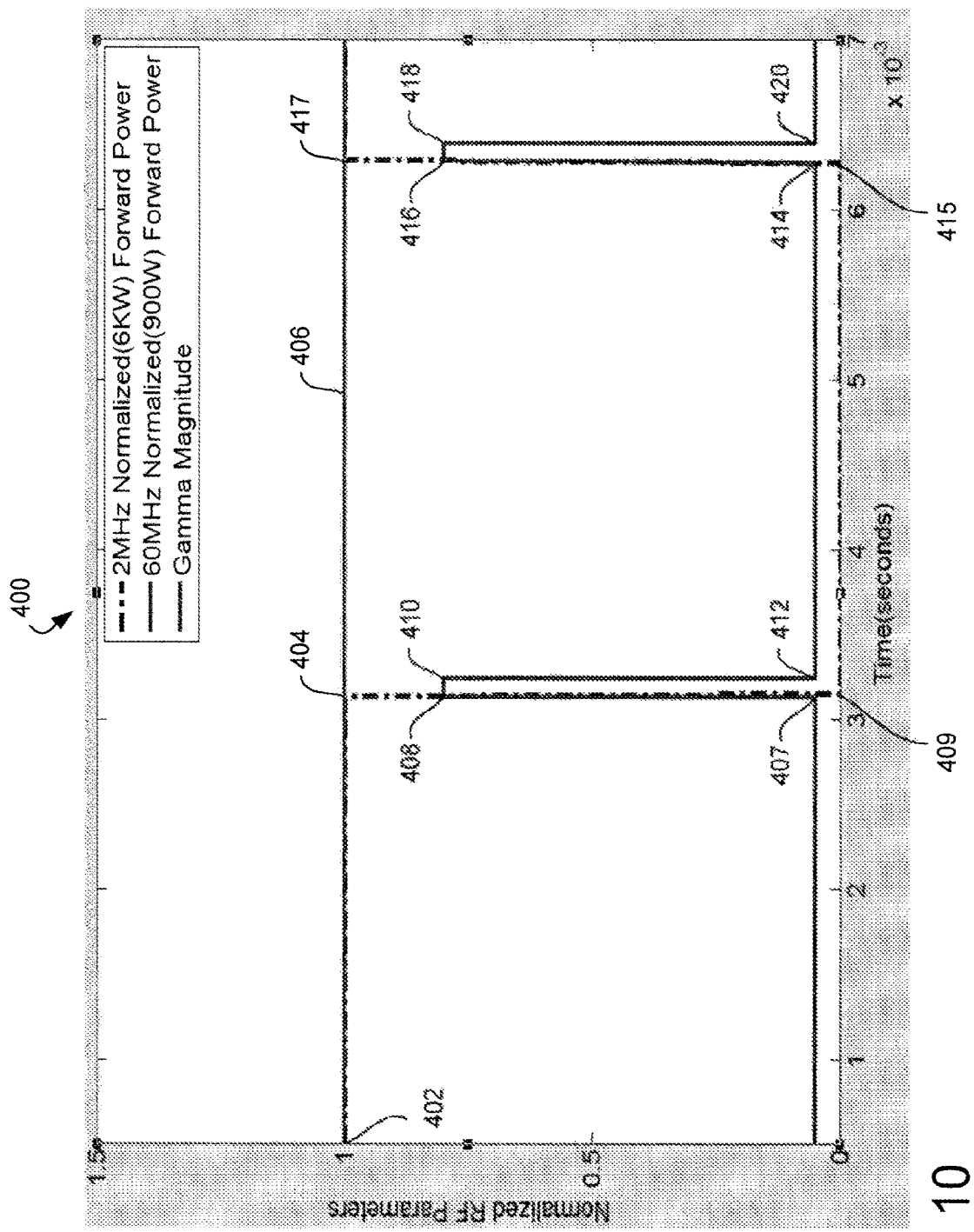
FIG. 10 shows an embodiment of a graph of normalized RF variables versus time for implementing RF tuning by a dependent RF generator for optimal production time power delivery during independent (IP) RF signal pulsing, in accordance with one embodiment described in the present disclosure.
Figure 11:
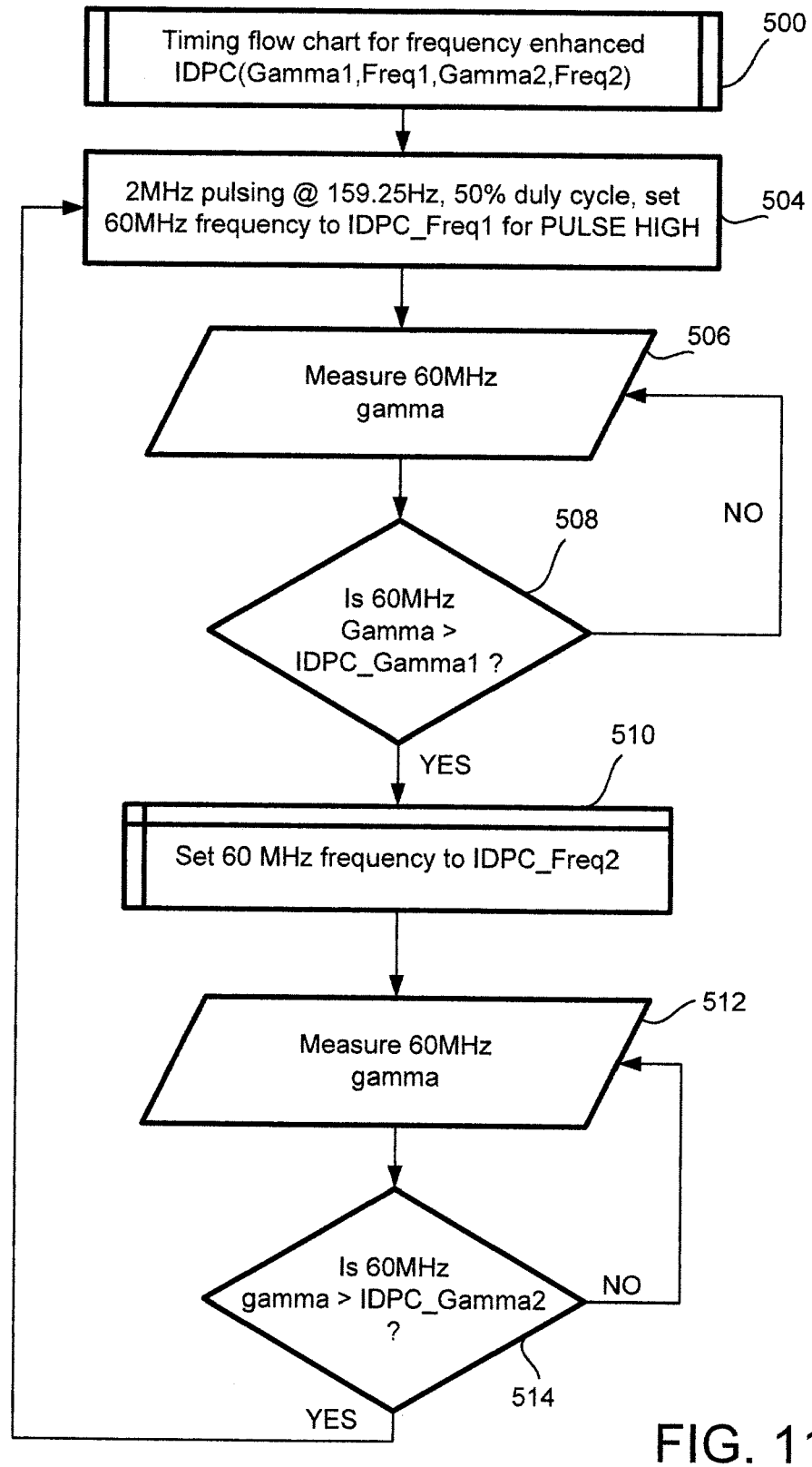
FIG. 11 is an embodiment of a flowchart of a method for implementing frequency tuning by a dependent RF generator for optimal power delivery during pulsing, in accordance with an embodiment described in the present disclosure.

FIG. 10 shows an embodiment of a graph 400 of normalized RF variables versus time for implementing RF tuning by the dependent RF generator for optimal production time power delivery during IP RF signal pulsing. Examples of the normalized RF variables include forward power and gamma values. FIG. 10 may be better understood when studied in conjunction with a flowchart of a method 500, an embodiment of which is shown in FIG. 11. The method 500 provides details regarding operations for implementing frequency tuning by the dependent RF generator for optimal power delivery during pulsing.

At a point 402, the 2 MHz IP RF generator is pulsed high and the 60 MHz dependent RF generator is set to its previously learned optimal RF frequency of IDPC_Freq1 (e.g., 61.3 MHz) or allowed to self-tune to this optimal RF frequency of IDPC_Freq1. This is seen in an operation 504 of FIG. 11. Thereafter, the dependent RF generator operates in the frequency tuning mode.

In the example of FIG. 10, the 2 MHz IP RF signal pulses at a pulsing frequency of 159.25 Hz with a 50% duty cycle, which may vary if desired, between a high power set point of 6 kW and a low power set point of 0 kW, which is not a requirement and can be non-zero. The 60 MHz dependent RF generator provides power at a power set point of 900 W. While the 60 MHz dependent RF generator delivers power to the plasma load within the plasma chamber 102, the dependent RF generator also monitors the gamma value via the sensor 212 as illustrated in operations 506 and 508 of FIG. 11.

At a point 404, the 2 MHz IP RF signal pulses low to a point 409. Shortly after this high-to-low transition, a gamma value measured by the 60 MHz dependent RF generator spikes from around 0.04 to around 0.8, e.g., from a point 407 to a point 408. If the IDPC_Gamma1 threshold is set at, e.g., 0.7, an excursion by the detected gamma value (branch YES of the operation 508) facilitates the 60 MHz RF generator to flip from one previously learned optimal tuned RF frequency value of IDPC_Freq1 to the other previously learned optimal tuned RF frequency value of IDPC_Freq2. This is seen in an operation 510 of FIG. 11. This tuning of the 60 MHz dependent RF generator from IDPC_Freq1 to IDPC_Freq2 in response to the high-to-low transition of the 2 MHz IP RF signal achieves a measured gamma value down to 0.05, e.g., from the point 410 to a point 412.

At a point 415, the 2 MHz IP RF signal pulses from low to high, e.g., reaches a point 417. Shortly after this low-to-high transition, a gamma value is measured in operations 512 and 514 by the dependent RF generator spikes from around 0.05 to around 0.78. The spike is illustrated between points 414 and 416.

If the IDPC_Gamma2 threshold is set at to trip at, for example, 0.75, the excursion by the detected gamma value, e.g., a YES branch of an operation 514 of FIG. 11, facilitates the 60 MHz RF generator to flip from the previously learned optimal tuned RF frequency value IDPC_Freq2 to the other previously learned optimal tuned RF frequency value of IDPC_Freq1. This is seen in the operation 504 of FIG. 11. This tuning of the 60 MHz dependent RF generator from IDPC_Freq2 to IDPC_Freq1 in response to the low-to-high transition of the 2 MHz IP RF signal brings the measured gamma value down to 0.04, e.g., from the point 418 to a point 420.

It should be noted that the time scale of FIG. 10 reflects a faster time scale than that of FIG. 3. The time scale of FIG. 10 illustrates production time and the time scale of FIG. 3 illustrates learning time. This is the case when, as mentioned, the high duration and the low duration of the IP RF pulse are artificially extended during learning time to permit the dependent RF generator to self-tune to the optimal tune RF frequencies for learning purposes. It should further be noted that the 60 MHz signal is illustrated as a signal 406 in FIG. 10.

In one embodiment, during production time, such self-tuning is not used since the dependent RF generator operates essentially as a state machine and flips from one learned optimal RF frequency to another learned optimal RF frequency as it detects the high-to-low transition of the IP RF signal and the low-to-high transition of the IP RF signal. The high-to-low transition is detected by comparing a measured gamma value to the IDPC_Gamma1 threshold and by determining the previous state of the IP RF signal prior to the detection of the gamma excursion. Moreover, the low-to-high transition is detected by comparing the measured gamma value versus the IDPC_Gamma2 threshold and by determining the previous state of the IP RF signal prior to the detection of the gamma excursion.

It should be noted that although the above-described embodiments relate to providing the 2 MHz RF signal and/or 60 MHz signal and/or 27 MHz signal to the lower electrode 104 and grounding the upper electrode 110, in several embodiments, the 2 MHz, 60 MHz, and 27 MHz signals are provided to the upper electrode 110 while the lower electrode 104 is grounded.

It is also noted that in one embodiment, an input, e.g., frequency input, power input, etc., or a level, e.g., power level, frequency level, includes one or more values that are within a limit, e.g., standard deviation, etc., of another value. For example, a power level includes the power value P21 and other power values that are within the limit of the power value P21. In this example, the power level excludes any power values for another state, e.g., power value P20 for state S0. As another example, a frequency input includes the frequency value F11 and other frequency values that are within a limit of the frequency value F11. In this example, the frequency input excludes any frequency values for another state, e.g., frequency value F10 for state S0.

It is noted that although the above-described embodiments are described with reference to parallel plate plasma chamber, in one embodiment, the above-described embodiments apply to other types of plasma chambers, e.g., a plasma chamber including an inductively coupled plasma (ICP) reactor, a plasma chamber including an electron-cyclotron resonance (ECR) reactor, etc. For example, the 2 MHz and the 60 MHz power supplies are coupled to an inductor within the ICP plasma chamber.

Moreover, although some of the above embodiments are described using gamma values, in an embodiment, impedance difference values can be used. For example, when the state of the TTL signal 112 is S1, the DSP 150 determines an impedance from reflected power over the transmission line 232 and also determines an impedance from forward power over the transmission line 232. The DSP 150 determines whether a first difference between the impedances exceeds a first limit and upon determining so, sends a signal indicating so and also indicating a value of the first difference. Upon receiving the signal indicating the value of the first difference, the AFT 118 retrieves from a memory device the frequency value F21 and the power controller 152 retrieves from a memory device the power value P21. The values F21 and P21 are then provided to the 60 MHz DA system.

Similarly, when the state of the TTL signal 112 is S0, the DSP 150 determines an impedance from reflected power over the transmission line 232 and also determines an impedance from forward power over the transmission line 232. The DSP 150 determines whether a second difference between the impedances exceeds a second limit and upon determining so, sends a signal indicating so and also indicating a value of the second difference. Upon receiving the signal indicating the value of the second difference, the AFT 120 retrieves from a memory device the frequency value F20 and the power controller 154 retrieves from a memory device the power value P20. The values F20 and P20 are then provided to the 60 MHz DA system.

In one embodiment, the operations performed by an AFT and/or a power controller of a generator controller are performed by a DSP of the generator controller. For example, the operations, described herein, as performed by the AFT 118 and 120 are performed by the DSP 150.

In an embodiment, the terms "driver and amplifier" and "DA system" are used interchangeably herein.

Embodiments described herein may be practiced with various computer system configurations including hand-held devices, microprocessor systems, microprocessor-based or programmable consumer electronics, minicomputers, mainframe computers and the like. The embodiments can also be practiced in distributed computing environments where tasks are performed by remote processing devices that are linked through a network.

With the above embodiments in mind, it should be understood that the embodiments can employ various computer-implemented operations involving data stored in computer systems. These operations are those requiring physical manipulation of physical quantities. Any of the operations described herein that form part of the embodiments are useful machine operations. The embodiments also relates to a device or an apparatus for performing these operations. The apparatus may be specially constructed for a special purpose computer. When defined as a special purpose computer, the computer can also perform other processing, program execution or routines that are not part of the special purpose, while still being capable of operating for the special purpose. Alternatively, the operations may be processed by a general purpose computer selectively activated or configured by one or more computer programs stored in the computer memory, cache, or obtained over a network. When data is obtained over a network the data may be processed by other computers on the network, e.g., a cloud of computing resources.

One or more embodiments can also be fabricated as computer-readable code on a non-transitory computer-readable medium. The non-transitory computer-readable medium is any data storage device that can store data, which can be thereafter be read by a computer system. Examples of the non-transitory computer-readable medium include hard drives, network attached storage (NAS), ROM, RAM, compact disc-ROMs (CD-ROMs), CD-recordables (CD-Rs), CD-rewritables (CD-RWs), magnetic tapes and other optical and non-optical data storage devices. The non-transitory computer-readable medium can include computer-readable tangible medium distributed over a network-coupled computer system so that the computer-readable code is stored and executed in a distributed fashion.

Although the method operations in the flowcharts above were described in a specific order, it should be understood that other housekeeping operations may be performed in between operations, or operations may be adjusted so that they occur at slightly different times, or may be distributed in a system which allows the occurrence of the processing operations at various intervals associated with the processing, as long as the processing of the overlay operations are performed in the desired way.

One or more features from any embodiment may be combined with one or more features of any other embodiment without departing from the scope described in various embodiments described in the present disclosure.

Although the foregoing embodiments have been described in some detail for purposes of clarity of understanding, it will be apparent that certain changes and modifications can be practiced within the scope of the appended claims. Accordingly, the present embodiments are to be considered as illustrative and not restrictive, and the embodiments are not to be limited to the details given herein, but may be modified within the scope and equivalents of the appended claims.

The invention claimed is:

1. A system comprising:
a primary generator coupled to an electrode, the primary generator including a primary driver and amplifier for supplying a primary radio frequency (RF) signal to the electrode, the primary generator further including a first primary automatic frequency tuner (AFT) coupled to the primary driver and amplifier, wherein the first primary AFT is configured to provide a first primary frequency input to the primary driver and amplifier when a pulsed signal is in a first state, the primary generator further including a second primary AFT coupled to the primary driver and amplifier, wherein the second primary AFT is configured to provide a second primary frequency input to the primary driver and amplifier when the pulsed signal is in a second state; and
a secondary generator coupled to the electrode, the secondary generator including a secondary driver and amplifier for supplying a secondary RF signal to the electrode, the secondary generator further including a first secondary AFT coupled to the secondary driver and amplifier, the secondary generator including a second secondary AFT coupled to the secondary driver and amplifier, the secondary generator including a processor, the processor coupled to the first secondary AFT and the second secondary AFT, the secondary generator further including one or more sensors, the one or more sensors for sensing current and voltage transferred between the secondary generator and the electrode during the first and second states, the processor configured to generate a parameter based on the current and voltage, the processor configured to determine whether a value of the parameter for the first state exceeds a first boundary and whether a value of the parameter for the second state exceeds a second boundary, the first secondary AFT configured to provide a first secondary frequency input to the secondary driver and amplifier upon receiving the determination that the value of the parameter for the first state exceeds the first boundary, the second secondary AFT configured to provide a second secondary frequency input to the secondary driver and amplifier upon receiving the determination that the value of the parameter for the second state exceeds the second boundary.

2. The system of claim 1, further comprising a selector coupled to the processor for selecting the first secondary AFT or the second secondary AFT, the selector for selecting the first secondary AFT in response to receiving a signal from the processor indicating that the first parameter exceeds the first boundary, the selector for selecting the second secondary AFT in response to receiving a signal from the processor indicating that the second parameter exceeds the second boundary.

3. The system of claim 1, wherein the electrode includes a lower electrode of a plasma chamber.

4. The system of claim 1, wherein during the first state, the primary driver and amplifier is configured to generate the primary RF signal having a lower frequency than that of the secondary RF signal, wherein the primary RF signal has a higher amount of power than the secondary RF signal.

5. The system of claim 1, wherein the processor is configured to determine whether the pulsed signal is in the first or the second state based on a magnitude of the pulsed signal.

6. The system of claim 1, wherein the parameter is gamma or an impedance difference.

7. A system comprising:
a digital pulsing source for generating a pulsed signal;
a primary generator including:
a primary driver and amplifier coupled to an electrode for generating a primary radio frequency (RF) signal to be transferred to the electrode;
one or more primary processors coupled to the digital pulsing source for receiving the pulsed signal, the one or more primary processors further coupled to the primary driver and amplifier,
the one or more primary processors configured to:
identify a first one of two states of the pulsed signal and a second one of the two states;
determine to provide a first primary frequency value to the primary driver and amplifier upon identifying that the pulsed signal is in the first state; and
determine to provide a second primary frequency value to the primary driver and amplifier upon identifying that the pulsed signal is in the second state;
a secondary generator including:
a secondary driver and amplifier coupled to the electrode for generating a secondary RF signal to be transferred to the electrode; and
one or more secondary processors coupled to the secondary driver and amplifier, the one or more secondary processors configured to:

determine whether a parameter associated with plasma exceeds a first boundary when the pulsed signal transitions to the first state from the second state;

determine whether the parameter exceeds a second boundary when the pulsed signal transitions to the second state from the first state;

determine to provide a first secondary frequency value to the secondary driver and amplifier in response to determining that the parameter exceeds the first boundary;

determine to provide a second secondary frequency value to the secondary driver and amplifier in response to determining that the parameter exceeds the second boundary.

8. The system of claim 7, wherein each of the first threshold and the second threshold are generated during a training routine, wherein the training routine is executed before a wafer is processed by applying the first and second thresholds.

9. The system of claim 7, wherein the parameter is gamma or an impedance difference.

10. The system of claim 7, wherein the electrode includes a lower electrode of a plasma chamber.

11. The system of claim 7, wherein during the first state, the primary driver and amplifier is configured to generate the primary RF signal having a lower frequency than that of the secondary RF signal, wherein the primary RF signal has a higher amount of power than the secondary RF signal.

12. The system of claim 7, wherein the first threshold is determined by extending a period for which the pulsed signal is in the first state, wherein the second threshold is determined by extending a period for which the pulsed signal is in the second state.

13. The system of claim 7, wherein the one or more primary processors determine whether the pulsed signal is in the first or the second state based on a magnitude of the pulsed signal.

* * * * *